(12) United States Patent
Son et al.

(10) Patent No.: US 12,439,602 B2
(45) Date of Patent: Oct. 7, 2025

(54) SEMICONDUCTOR DEVICE INCLUDING DATA STORAGE PATTERN WITH IMPROVED RETENTION CHARACTERISTICS

(71) Applicant: Samsung Electronics Co., Ltd., Suwon-si (KR)

(72) Inventors: Younghwan Son, Hwaseong-si (KR); Sanghoon Jeong, Suwon-si (KR); Sangjun Hong, Hwaseong-si (KR); Seogoo Kang, Seoul (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 18/094,007

(22) Filed: Jan. 6, 2023

(65) Prior Publication Data

US 2023/0157023 A1 May 18, 2023

Related U.S. Application Data

(63) Continuation of application No. 16/885,499, filed on May 28, 2020, now Pat. No. 11,552,098.

(30) Foreign Application Priority Data

Sep. 6, 2019 (KR) .................. 10-2019-0110621

(51) Int. Cl.
  *H10B 43/27* (2023.01)
  *H10B 43/10* (2023.01)
  *H10B 43/35* (2023.01)

(52) U.S. Cl.
  CPC ............. *H10B 43/27* (2023.02); *H10B 43/10* (2023.02); *H10B 43/35* (2023.02)

(58) Field of Classification Search
  CPC ........ H10B 69/00; H10B 53/00; H10B 53/10; H10B 53/20; H10B 53/30; H10B 53/40;
  (Continued)

(56) References Cited

U.S. PATENT DOCUMENTS 9,287,283 B2  3/2016  Lim et al.
9,666,593 B2  5/2017  Pang et al.
(Continued)

FOREIGN PATENT DOCUMENTS

CN  107946307 A  4/2018
CN  110120393 A  8/2019
(Continued)

OTHER PUBLICATIONS

Office Action issued May 20, 2024 by the Korean Intellectual Property Office for corresponding Korean Application KR 10-2019-0110621.

(Continued)

*Primary Examiner* — William B Partridge
*Assistant Examiner* — Gustavo G Ramallo
(74) *Attorney, Agent, or Firm* — Muir Patent Law, PLLC

(57) ABSTRACT

A semiconductor device includes a lower structure; a stack structure including gate layers and interlayer insulating layers and having an opening; a vertical structure in the opening; a contact structure on the vertical structure; and a conductive line on the contact structure. The vertical structure includes an insulating core region, a channel semiconductor layer covering side and lower surfaces of the insulating core region, data storage patterns between the channel semiconductor layer and the gate layers and spaced apart from each other, a first dielectric layer, and a second dielectric layer. At least a portion of the first dielectric layer is between the data storage patterns and the gate layers, at least a portion of the second dielectric layer is between the
(Continued)

data storage patterns and the channel semiconductor layer, and the insulating core region includes first convex portions having increased widths in regions facing the gate layers.

20 Claims, 20 Drawing Sheets

(58) Field of Classification Search
CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 9,673,217 B1* | 6/2017 | Sakata | H10B 43/27 |
| 9,997,533 B2 | 6/2018 | Yoshimizu et al. | |
| 10,115,732 B2 | 10/2018 | Yu et al. | |
| 10,381,376 B1 | 8/2019 | Nishikawa et al. | |
| 10,700,090 B1 | 6/2020 | Cui et al. | |
| 2009/0230458 A1* | 9/2009 | Ishiduki | H10D 30/693 |
| | | | 257/E21.21 |
| 2009/0283819 A1 | 11/2009 | Ishikawa et al. | |
| 2009/0321813 A1* | 12/2009 | Kidoh | H10B 43/27 |
| | | | 257/E21.423 |
| 2010/0034028 A1 | 2/2010 | Katsumata et al. | |
| 2010/0140684 A1 | 6/2010 | Ozawa | |
| 2015/0008505 A1* | 1/2015 | Chien | H10D 30/0411 |
| | | | 257/324 |
| 2015/0102346 A1* | 4/2015 | Shin | H01L 21/76802 |
| | | | 257/329 |
| 2015/0162342 A1* | 6/2015 | Lee | H10D 30/025 |
| | | | 438/269 |
| 2015/0357413 A1 | 12/2015 | Zhang et al. | |
| 2016/0225786 A1 | 8/2016 | Lee et al. | |
| 2016/0293623 A1 | 10/2016 | Simsek-Ege et al. | |
| 2017/0221921 A1 | 8/2017 | Kanamori et al. | |
| 2018/0033799 A1 | 2/2018 | Kanamori et al. | |
| 2018/0097006 A1 | 4/2018 | Kim et al. | |
| 2018/0108672 A1 | 4/2018 | Choi et al. | |
| 2018/0130816 A1 | 5/2018 | Son et al. | |
| 2019/0103411 A1 | 4/2019 | Liu et al. | |
| 2019/0198509 A1 | 6/2019 | Kim | |
| 2019/0244970 A1 | 8/2019 | Jung et al. | |
| 2020/0127126 A1 | 4/2020 | Lee | |

FOREIGN PATENT DOCUMENTS

| | | |
|---|---|---|
| KR | 1020170090045 A | 8/2017 |
| KR | 1020180012640 A | 2/2018 |
| KR | 10-2018-0041289 | 11/2023 |
| KR | 10-2019-0095812 B1 | 2/2024 |

OTHER PUBLICATIONS

Written Opinion dated Sep. 30, 2024, issued from the Intellectual Property Office of Singapore, for corresponding Patent Application No. SG 10202007029Q.

Office Action dated Dec. 12, 2024 for corresponding application No. IN 202044036700.

* cited by examiner

SEMICONDUCTOR DEVICE INCLUDING DATA STORAGE PATTERN WITH IMPROVED RETENTION CHARACTERISTICS

CROSS-REFERENCE TO RELATED APPLICATION(S)

This application is a continuation of U.S. application Ser. No. 16/885,499, filed May 28, 2020, in the U.S. Patent and Trademark Office, which claims benefit of priority under 35 U.S.C. § 119 to Korean Patent Application No. 10-2019-0110621, filed on Sep. 6, 2019, in the Korean Intellectual Property Office, the disclosures of both of which are incorporated herein by reference in their entireties.

BACKGROUND

The present inventive concept relates to a semiconductor device, and more particularly, to a semiconductor device including a data storage pattern, and a method of forming the same.

In order to increase the price competitiveness of products, there is growing demand for improving the degree of integration of a semiconductor device. In order to improve the degree of integration of a semiconductor device, a semiconductor device having three-dimensional array of memory cells, instead of two-dimensional array of memory cells, has been proposed.

SUMMARY

An aspect of the present inventive concept is to provide a semiconductor device capable of improving a degree of integration.

An aspect of the present inventive concept is to provide a method of forming a semiconductor device capable of improving a degree of integration.

According to an aspect of the present inventive concept, a semiconductor device includes a lower structure; a stack structure on the lower structure and having an opening; a vertical structure in the opening; a contact structure on the vertical structure; and a conductive line on the contact structure, wherein the stack structure comprises a plurality of gate layers and a plurality of interlayer insulating layers, wherein the vertical structure comprises an insulating core region, a channel semiconductor layer, a plurality of data storage patterns, a first dielectric layer, and a second dielectric layer, wherein the insulating core region extends in a vertical direction, the vertical direction being perpendicular to an upper surface of the lower structure, wherein the channel semiconductor layer covers a side surface and a lower surface of the insulating core region, wherein the plurality of data storage patterns are disposed between the channel semiconductor layer and the plurality of gate layers, and are disposed to be spaced apart from each other in the vertical direction, wherein at least a portion of the first dielectric layer is disposed between the plurality of data storage patterns and the plurality of gate layers, wherein at least a portion of the second dielectric layer is disposed between the plurality of data storage patterns and the channel semiconductor layer, and wherein the insulating core region comprises a plurality of first convex portions having increased widths in regions facing the plurality of gate layers.

According to an aspect of the present inventive concept, a semiconductor device includes a lower structure; a stack structure including an interlayer insulating layer and a gate layer, sequentially stacked on the lower structure; and a vertical structure passing through the stack structure, wherein the vertical structure comprises an insulating core region passing through the interlayer insulating layer and the gate layer, a channel semiconductor layer covering at least a side surface of the insulating core region, a data storage pattern between the channel semiconductor layer and the gate layer, a first dielectric layer at least interposed between the data storage pattern and the gate layer, and a second dielectric layer at least interposed between the data storage pattern and the channel semiconductor layer, wherein the data storage pattern has a first side surface facing the gate layer, and a second side surface facing the channel semiconductor layer, and wherein the second side surface of the data storage pattern has a concave portion.

According to an aspect of the present inventive concept, a semiconductor device includes a lower structure; a stack structure including an interlayer insulating layer and a gate layer, sequentially stacked on the lower structure; and a vertical structure passing through the stack structure, wherein the vertical structure comprises an insulating core region passing through the interlayer insulating layer and the gate layer, a channel semiconductor layer covering at least a side surface of the insulating core region, a data storage pattern between the channel semiconductor layer and the gate layer, a first dielectric layer at least interposed between the data storage pattern and the gate layer, and a second dielectric layer at least interposed between the data storage pattern and the channel semiconductor layer, and wherein the insulating core region has at least two inflection points in regions facing the gate layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
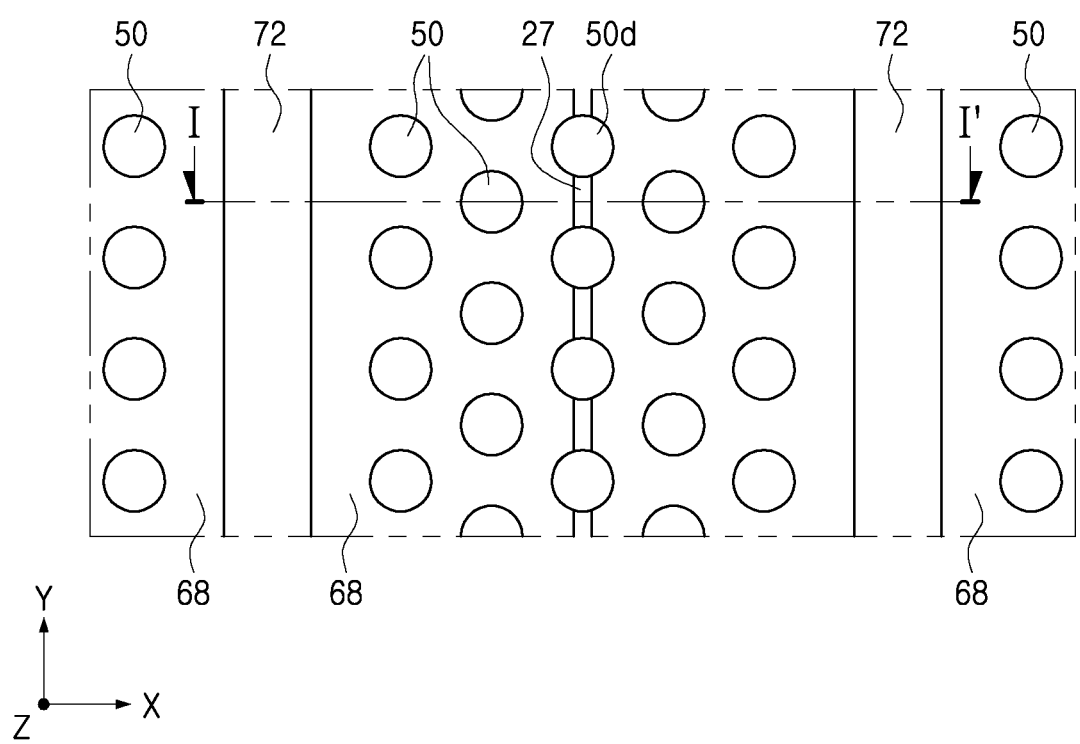
FIG. 1 is a plan view illustrating a portion of a semiconductor device, according to an example embodiment of the present inventive concept.

Hereinafter, example embodiments of the present inventive concept will be described with reference to the accompanying drawings. In the drawings, like numbers refer to like elements throughout.

Figure 2:
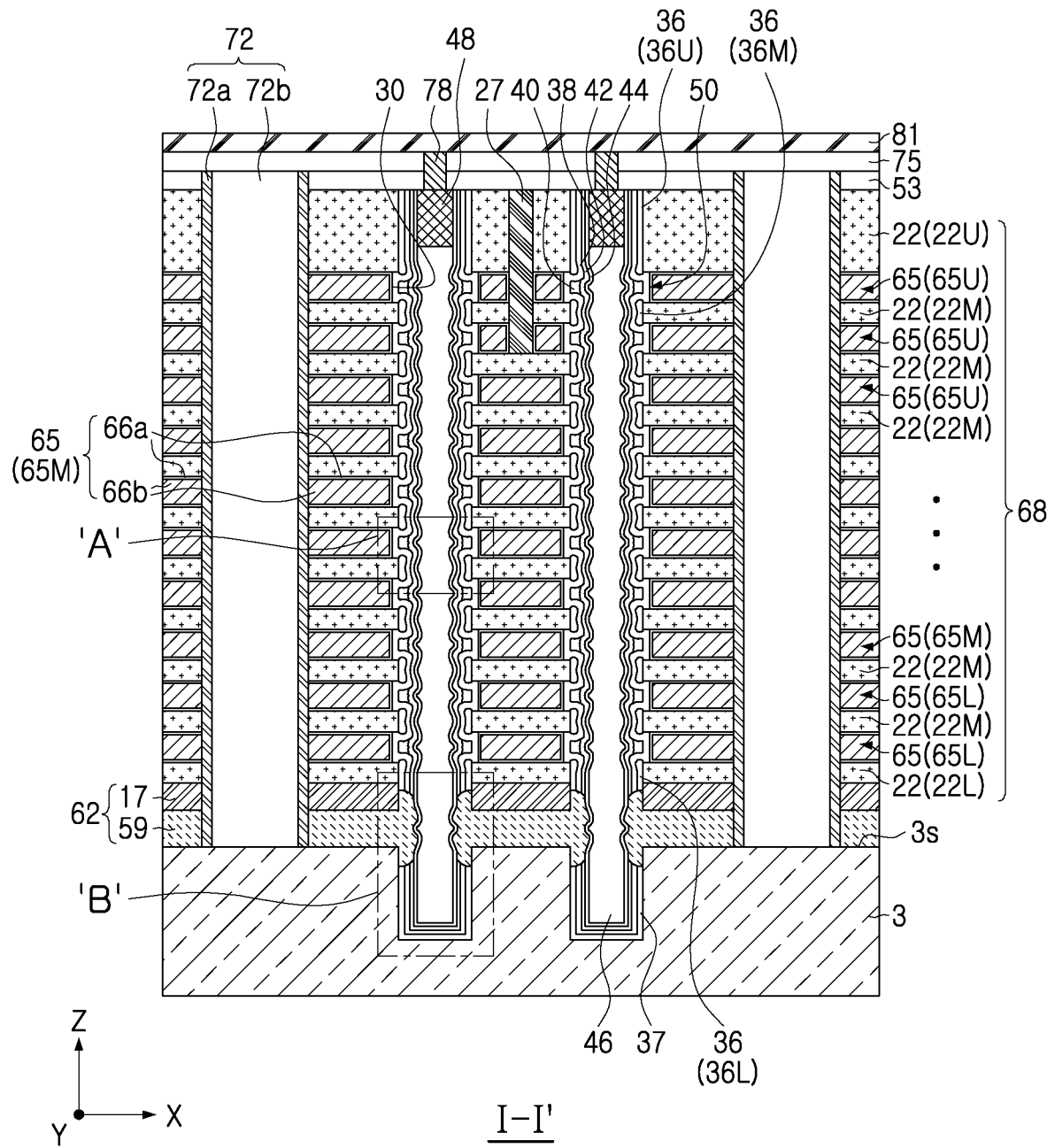
FIG. 2 is a cross-sectional view illustrating an example of a semiconductor device, according to an example embodiment of the present inventive concept.
Figure 3:
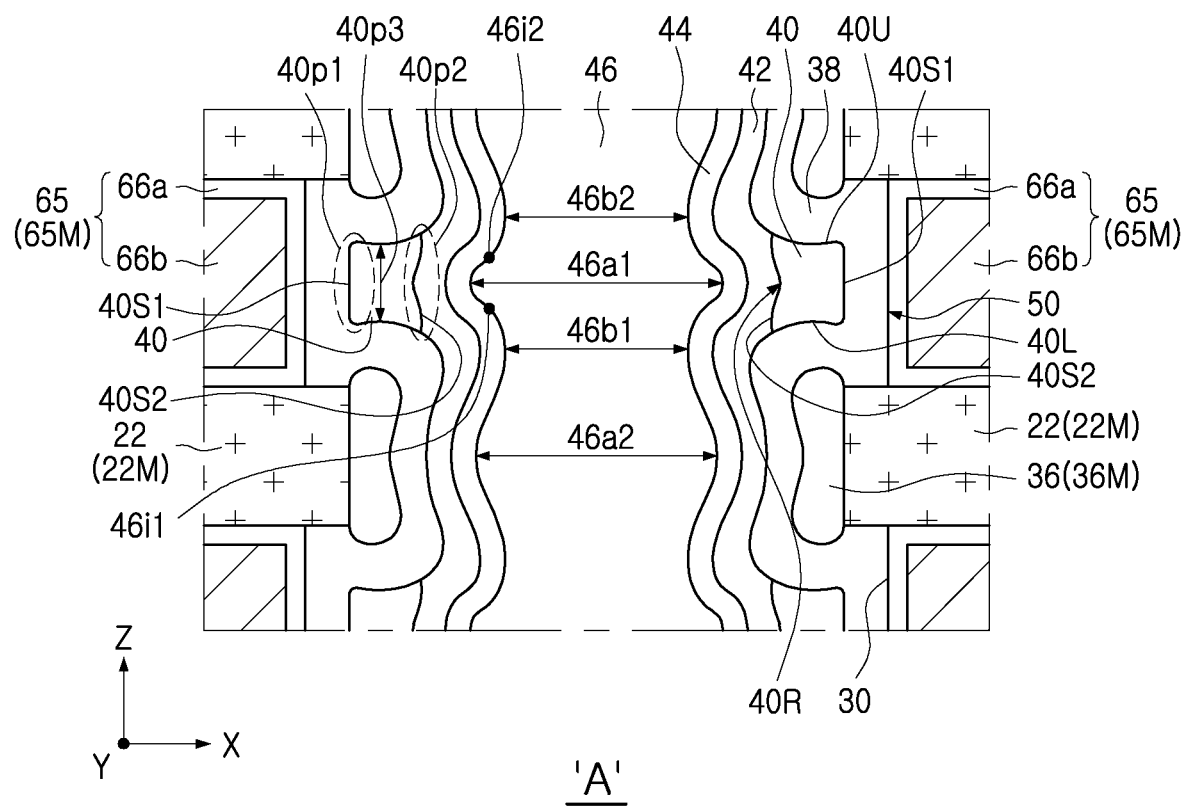
FIG. 3 is a partially enlarged view illustrating portion 'A' of FIG. 2.
Figure 4:
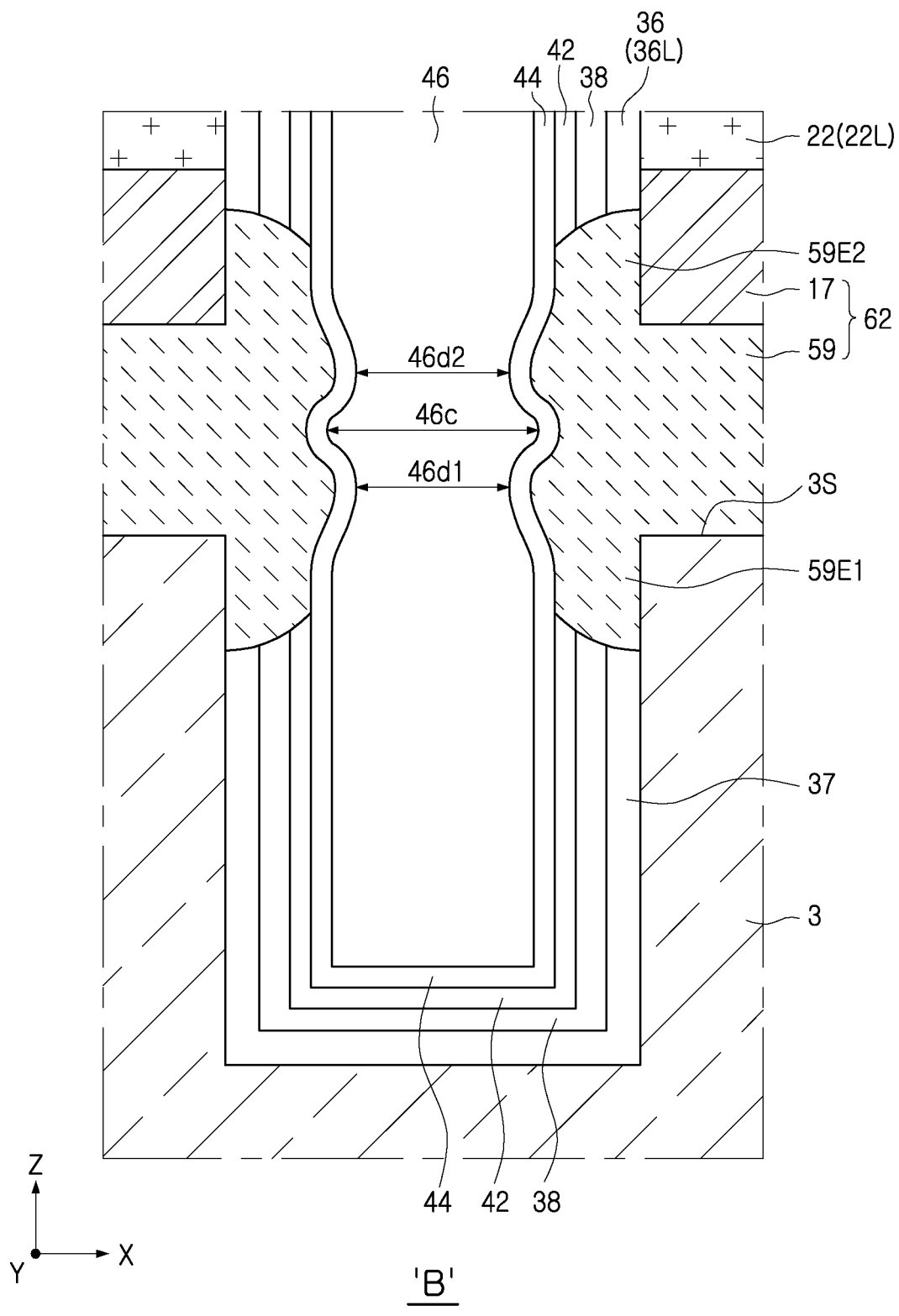
FIG. 4 is a partially enlarged view illustrating portion 'B' of FIG. 2.

FIG. 1 is a plan view illustrating a portion of a semiconductor device according to an example embodiment of the present inventive concept, FIG. 2 is a cross-sectional view illustrating a region taken along cross-sectional line I-I' of FIG. 1 to illustrate an example of a semiconductor device according to an example embodiment of the present inventive concept, FIG. 3 is a partially enlarged view illustrating portion 'A' of FIG. 2, and FIG. 4 is a partially enlarged view illustrating portion 'B' of FIG. 2.

Referring to FIGS. 1 to 4, a stack structure 68 may be disposed on a lower structure 3. In an example, the lower structure 3 may include a semiconductor substrate. The stack structure 68 may include a plurality of interlayer insulating layers 22 and a plurality of gate layers 65, alternately stacked.

A horizontal connection structure 62 may be disposed between the lower structure 3 and the stack structure 68. The horizontal connection structure 62 may include a lower horizontal connection pattern 59, and an upper horizontal connection pattern 17 on the lower horizontal connection pattern 59. The lower horizontal connection pattern 59 and the upper horizontal connection pattern 17 may be formed of polysilicon having N-type conductivity.

An opening 30 passing through the stack structure 68 may be disposed. A vertical structure 50 may be disposed in the opening 30. The vertical structure 50 may pass through the stack structure 68, may extend in a downward direction (e.g., toward the upper surface 3s of the lower structure 3), may pass through the horizontal connection structure 62, and may extend into the lower structure 3. When viewed in plan view, the vertical structure 50 may have a circular shape, an elliptical shape, an oval shape, etc.

A first upper insulating layer 53 and a second upper insulating layer 75 sequentially stacked on the stack structure 68 and the vertical structure 50 may be arranged. For example, the first upper insulating layer 53 may be formed on an upper surface of the uppermost interlayer insulating layers 22U of the interlayer insulating layers 22, and the second upper insulating layer 75 may be formed on an upper surface of the first upper insulating layer 53.

Separation structures 72 passing through the first upper insulating layer 53 and the stack structure 68 may be disposed. Each of the separation structures 72 may include a separation spacer 72a and a separation pattern 72b. The separation spacer 72a may be disposed on a side surface of the separation pattern 72b, contacting the side surface of the separation pattern 72b. In an example, the separation spacer 72a may be formed of an insulating material, and the separation pattern 72b may be formed of a conductive material. In another example, the separation structures 72 may be formed of an insulating material. For example, the separation structures 72 may be formed of a silicon oxide.

The separation structures 72 may pass through the first upper insulating layer 53, may extend in the downward direction (e.g., toward the upper surface 3s of the lower structure 3), and may pass through the horizontal connection structure 62. The separation structures 72 may separate the stack structure 68 in a first horizontal direction X. The separation structures 72 may have a linear shape extending lengthwise in a second horizontal direction Y, perpendicular to the first horizontal direction X. The first and second horizontal directions X and Y may be parallel to an upper surface 3s of the lower structure 3.

A conductive line 81 may be disposed on the second upper insulating layer 75. A contact plug 78 may be disposed between the conductive line 81 and the vertical structure 50.

The stack structure 68 may include the interlayer insulating layers 22 and the gate layers 65, alternately and repeatedly stacked.

In an example, each of the plurality of gate layers 65 may include a first layer 66a and a second layer 66b. The first layer 66a may extend between the first layer 66a and the vertical structure 50 while covering lower and upper surfaces of the second layer 66b.

In an example, the second layer 66b may include a conductive material (e.g., doped polysilicon, TiN, TaN, WN, TiSi, TaSi, CoSi, WSi, Ti, Ta, W, or the like), and the first layer 66a may comprise a dielectric material. The dielectric material of the first layer 66a may be a high-k dielectric such as AlO, or the like. In another example, the first layer 66a may be replaced with a conductive material, different from the conductive material of the second layer 66b (e.g. TiN, WN, or the like).

The plurality of gate layers 65 may include one or a plurality of lower gate layers 65L, a plurality of intermediate gate layers 65M on the one or plurality of lower gate layers 65L, and one or a plurality of upper gate layers 65U on the plurality of intermediate gate layers 65M.

At least one lower gate layer 65L, among the one or the plurality of lower gate layers 65L, may include a ground select gate electrode, and at least one upper gate layer 65U, among the one or the plurality of upper gate layers 65U, may include a string select gate electrode. The plurality of intermediate gate layers 65M may include word lines. For example, second layers 66b of the plurality of intermediate gate layers 65M may be the word lines.

The interlayer insulating layers 22 may include a lowermost interlayer insulating layer 22L, an uppermost interlayer insulating layer 22U, and intermediate interlayer insulating layers 22M between the lowermost interlayer insulating layer 22L and the uppermost interlayer insulating layer 22U. Among the interlayer insulating layers 22, the uppermost interlayer insulating layer 22U may have a thickness greater than that of each of the remaining interlayer insulating layers 22. The interlayer insulating layers 22 may be formed of silicon oxide.

An insulating pattern 27 extending from an upper surface of the stack structure 68 in the downward direction (e.g., toward an upper surface 3s of the lower structure 3) and passing through the one or more upper gate layers 65U may be disposed. The insulating pattern 27 may be formed of silicon oxide. The vertical structure 50 may be spaced apart from the insulating pattern 27. For example, the insulating pattern 27 may be disposed between and spaced apart from adjacent ones of the vertical structures 50. A dummy structure 50d contacting the insulating pattern 27 and passing through the stack structure 68 may be disposed (FIG. 1). A cross-sectional structure of the dummy structure 50d of FIG. 1 may be the same as a cross-sectional structure of the vertical structure 50. In some embodiments, the dummy structures 50d may be formed in the same processes and may include the same materials as the vertical structures 50; however, the dummy structures 50d may not be effective to function for operations.

Reinforcing patterns 36 may be arranged adjacent to the vertical structure 50. The reinforcing patterns 36 may be formed of an insulating material such as silicon oxide, or the like.

In an example, the reinforcing patterns 36 may be adjacent to a side surface of the vertical structure 50, and may be spaced apart from each other in a vertical direction Z. The vertical direction Z may be a direction perpendicular to the upper surface 3s of the lower structure 3. The reinforcing patterns 36 may be disposed between the interlayer insulating layers 22 and the vertical structure 50. The reinforcing patterns 36 may include a lower reinforcing pattern 36L interposed between the lowermost interlayer insulating layer 22L and the vertical structure 50 and extending between a portion of the horizontal connection structure 62 and the vertical structure 50. For example, the lower reinforcing pattern 36L may be disposed between the upper horizontal connection pattern 17 and the vertical structure 50. In addition, the reinforcing patterns 36 may include an upper reinforcing pattern 36U interposed between the uppermost interlayer insulating layer 22U and the vertical structure 50, and an intermediate reinforcing patterns 36M interposed between the intermediate interlayer insulating layers 22M and the vertical structure 50.

Each of the intermediate reinforcing patterns 36M may be in contact with a corresponding one of the intermediate interlayer insulating layers 22M. Each of the intermediate reinforcing patterns 36M may have a vertical thickness greater than that of each of the intermediate interlayer insulating layers 22M. In this case, the vertical thickness refers to a thickness in the vertical direction (Z direction). Each of the intermediate reinforcing patterns 36M may be concave in a central portion of the intermediate reinforcing patterns 36M, facing the vertical structure 50.

A substrate insulating layer 37 interposed between the vertical structure 50 and the lower structure 3 may be disposed. The substrate insulating layer 37 may be at a lower vertical level than that of the upper surface 3s of the lower structure 3. The substrate insulating layer 37 may be formed of silicon oxide.

In an example, the vertical structure 50 may include an insulating core region 46, a channel semiconductor layer 44, a plurality of data storage patterns 40, a first dielectric layer 38, a second dielectric layer 42, and a pad pattern 48.

The insulating core region 46 may extend in the vertical direction Z. The insulating core region 46 may include an insulating material. For example, the insulating core region 46 may be filled with an insulating material such as silicon oxide, or the like, or may be formed of an insulating material having a void therein.

The pad pattern 48 may be disposed on the insulating core region 46, and may contact a top surface of the insulating core region 46. The pad pattern 48 may be formed of polysilicon having N-type conductivity.

At least a portion of the channel semiconductor layer 44 may cover a side surface and a lower surface of the insulating core region 46, contacting the side surface and the lower surface of the insulating core region 46. The channel semiconductor layer 44 may be in contact with the pad pattern 48. For example, the channel semiconductor layer 44 may contact a side surface of the pad pattern 48. Therefore, the channel semiconductor layer 44 may be electrically connected to the pad pattern 48. The channel semiconductor layer 44 may be formed of polysilicon.

The plurality of data storage patterns 40 may be spaced apart from each other in the vertical direction Z while being disposed between the plurality of gate layers 65 and the channel semiconductor layer 44. The plurality of data storage patterns 40 may face the plurality of gate layers 65 in a one-to-one manner.

The plurality of data storage patterns 40 may be formed of a material capable of storing data. For example, when a semiconductor device according to an example embodiment of the present inventive concept is a memory device such as a NAND flash, the plurality of data storage patterns 40 may be formed of a material capable of charge trapping, for example, silicon nitride.

In example embodiments of the present inventive concept, the material of the plurality of data storage patterns 40 is not limited to silicon nitride, and may be replaced with another material capable of storing data.

At least a portion of the first dielectric layer 38 may be disposed between the plurality of data storage patterns 40 and the plurality of gate layers 65. The first dielectric layer 38 may extend from a portion interposed between the plurality of data storage patterns 40 and the plurality of gate layers 65, to cover the reinforcing patterns 36. For example, a portion of the first dielectric layer 38 may be disposed between the reinforcing patterns 36 and the second dielectric layer 42, contacting both the reinforcing patterns 36 and the second dielectric layer 42.

At least a portion of the second dielectric layer 42 may be disposed between the plurality of data storage patterns 40 and the channel semiconductor layer 44, contacting both the plurality of data storage patterns 40 and the channel semiconductor layer 44. The second dielectric layer 42 may extend from a portion interposed between the plurality of data storage patterns 40 and the channel semiconductor layer 44, to cover the first dielectric layer 38.

Between the channel semiconductor layer 44 and the plurality of gate layers 65, the plurality of data storage patterns 40 may be disposed between the first dielectric layer 38 and the second dielectric layer 42. The first dielectric layer 38 may cover a lower surface of the channel semiconductor layer 44, and may cover an external side surface of the channel semiconductor layer 44. The second dielectric layer 42 may be disposed between the channel semiconductor layer 44 and the first dielectric layer 38.

The horizontal connection structure 62 may include one or a plurality of horizontal connection patterns. For example, the horizontal connection structure 62 may include the lower horizontal connection pattern 59, and the upper horizontal connection pattern 17 on the lower horizontal connection pattern 59. The lower horizontal connection pattern 59 and the upper horizontal connection pattern 17 may be formed of polysilicon. For example, the lower horizontal connection pattern 59 and the upper horizontal connection pattern 17 may be formed of polysilicon having N-type conductivity. The upper horizontal connection pattern 17 may be spaced apart from the channel semiconductor layer 44. The lower horizontal connection pattern 59 may pass through the first dielectric layer 38 and the second dielectric layer 42, and may contact the channel semiconductor layer 44. The lower horizontal connection pattern 59 may further include a first extension portion 59E1 extending between the lower structure 3 and the channel semiconductor layer 44, and a second extension portion 59E2 extending between the upper horizontal connection pattern 17 and the channel semiconductor layer 44. In some embodiments, the first extension portion 59E1 may contact upper surfaces of the substrate insulating layer 37, the first dielectric layer 38, and the second dielectric layer 42, and the second extension portion 59E2 may contact lower surfaces of the lower reinforcing pattern 36L, the first dielectric layer 38, and the second dielectric layer 42.

A vertical thickness of each of the plurality of data storage patterns 40 may be smaller than a vertical thickness of each of the plurality of gate layers 65.

Each of the plurality of data storage patterns 40 may have a lower surface 40L and an upper surface 40U. In each of the plurality of data storage patterns 40, at least one of the lower surface 40L and the upper surface 40U may have a concave shape. For example, in some embodiments, the lower surface 40L and the upper surface 40U each may have a concave shape.

Each of the plurality of data storage patterns 40 may include a first side surface 40S1 facing the plurality of gate layers 65, and a second side surface 40S2 facing the channel semiconductor layer 44. Each of the plurality of data storage patterns 40 may include a first portion 40p1 adjacent to the first side surface 40S1, a second portion 40p2 adjacent to the second side surface 40S2, and a minimum vertical thickness portion 40p3 between the first portion 40p1 and the second portion 40p2. A thickness of the minimum vertical thickness portion 40p3 may be less than a maximum vertical thickness of the first portion 40p1 and a maximum vertical thickness of the second portion 40p2.

In each of the plurality of data storage patterns 40, a distance between the minimum vertical thickness portion 40p3 and the first side surface 40S1 may be less than a distance between the minimum vertical thickness portion 40p3 and the second side surface 40S2. For example, the minimum vertical thickness portion 40p3 may be nearer to the first side surface 40S1 than to the second side surface 40S2.

In each of the plurality of data storage patterns 40, the second side surface 40S2 may have a concave portion 40R. The second side surface 40S2 may have curved shapes above and below the concave portion 40R.

In an example, a distance between an upper end and a lower end of the first side surface 40S1 may be less than a distance between an upper end and a lower end of the second side surface 40S2.

The insulating core region 46 may include a plurality of first convex portions 46a1 having increased widths in regions facing the plurality of gate layers 65. The insulating core region 46 may include a plurality of second convex portions 46a2 having increased widths in regions facing the plurality of interlayer insulating layers 22, and concave portions 46b1 and 46b2 having decreased widths between the first convex portions 46a1 and the second convex portions 46a2. Each of the concave portions 46b1 and 46b2 may have a width less than that of each of the first and second convex portions 46a1 and 46a2.

Hereinafter, for convenience of description, the description will be made based on any one of the first convex portions 46a1 facing any one of the gate layers 65.

A portion of the insulating core region 46 may include any one of the first convex portions 46a1, a first concave portion 46b1 disposed below the first convex portion 46a1 and having a width less than that of the first convex portion 46a1, and a second concave portion 46b2 disposed on the first convex portion 46a1 and having a width less than that of the first convex portion 46a1. A portion of the insulating core region 46 may further include the second convex portion 46a2 disposed below the first concave portion 46b1 and having a width greater than that of the first concave portion 46b1. A portion having a minimum horizontal width in the first concave portion 46b1, and a portion having a minimum horizontal width in the second concave portion 46b2 may face any one of the gate layers 65.

A distance between the portion having the minimum horizontal width in the first concave portion 46b1 and the portion having the minimum horizontal width in the second concave portion 46b2 may be greater than the maximum vertical width of any one of the data storage patterns 40.

The distance between the portion having the minimum horizontal width in the first concave portion 46b1 and the portion having the minimum horizontal width in the second concave portion 46b2 may be less than a vertical thickness of any one of the gate layers 65. For example, both of the first concave portion 46b1 and the second concave portion 46b2 may be at a higher vertical level than a lower surface of an adjacent gate layer 65 and at a lower vertical level than an upper surface of the adjacent gate layer 65.

A distance between a portion having a maximum horizontal width in the second convex portion 46a2 and the portion having the minimum horizontal width in the first concave portion 46b1 may be greater than a distance between the portion having the minimum horizontal width in the first concave portion 46b1 and a portion having a maximum horizontal width in the first convex portion 46a1.

A distance between a first inflection point 46i1 between a side surface of the first concave portion 46b1 and a side surface of the first convex portion 46a1 and a second inflection points 46i2 between a side surface of the first convex portion 46a1 and a side surface of the second concave portion 46b2 may be less than the vertical thickness of any one of the gate layers 65. The first inflection point 46i1 may be the point at which the concavity (or convexity) changes between the first convex portion 46a1 and the first concave portion 46b1, and the second inflection point 46i2 may be the point at which the concavity (or convexity) changes between the first convex portion 46a1 and the second concave portion 46b2.

The distance between the first inflection point 46i1 between the side surface of the first concave portion 46b1 and the side surface of the first convex portion 46a1 and the second inflection points 46i2 between the side surface of the first convex portion 46a1 and the side surface of the second concave portion 46b2 may be less than the maximum vertical width of any one of the data storage patterns 40.

The insulating core region 46 may further include a lower convex portion 46c (of FIG. 4) facing the lower horizontal connection pattern 59, a first lower concave portion 46d1 (of FIG. 4) disposed below the lower convex portion 46c and having a smaller width than that of the lower convex portion 46c, and a second lower concave portion 46d2 (of FIG. 4) disposed on the lower convex portion 46c and having a smaller width than that of the lower convex portion 46c.

In an example, the data storage patterns 40 may be spaced apart from each other in the vertical direction Z. Therefore, interference between the data storage patterns 40 adjacent to each other in the vertical direction Z may be prevented, and a phenomenon in which a charge trapped in the data storage patterns 40 by the operation of a NAND flash memory device moves to a region other than the data storage patterns 40 may be prevented. Therefore, in a semiconductor device such as a NAND flash memory device, data retention characteristics may be improved.

Figure 5:
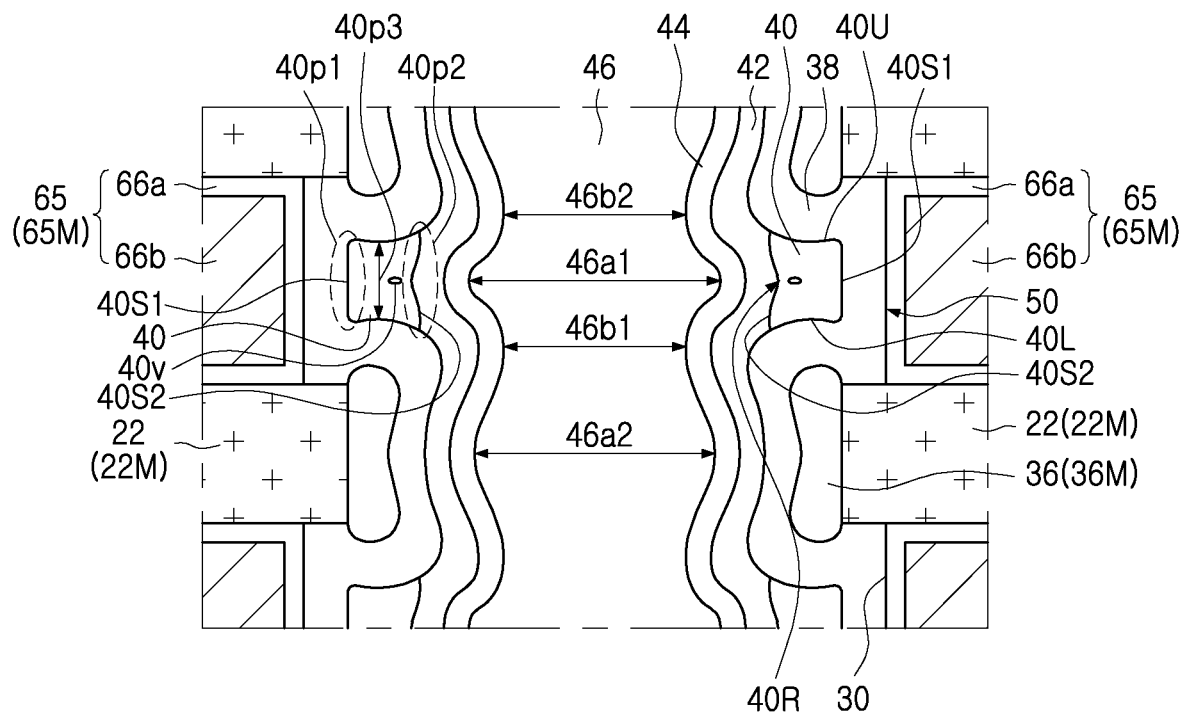
FIG. 5 is a partially enlarged view illustrating a modified example of a semiconductor device, according to an example embodiment of the present inventive concept.
Figure 6:
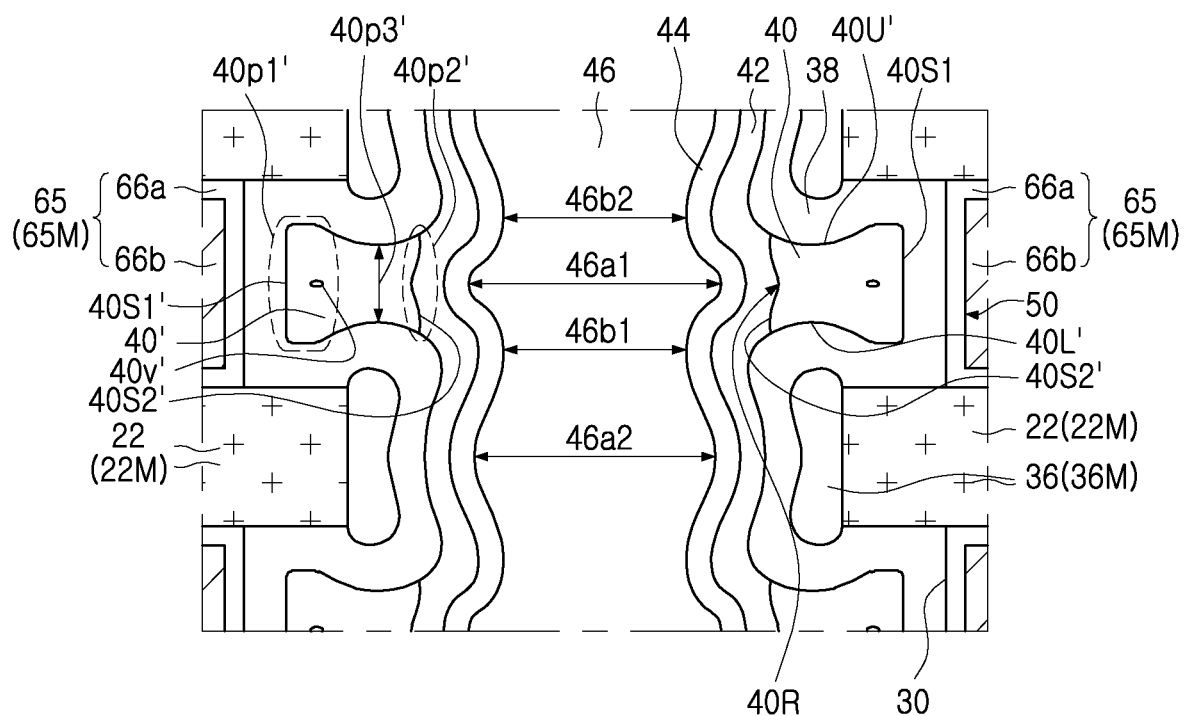
FIG. 6 is a partially enlarged view illustrating a modified example of a semiconductor device, according to an example embodiment of the present inventive concept.

Next, modified examples of the plurality of data storage patterns 40 described above will be described with reference to FIGS. 5 and 6, respectively. FIGS. 5 and 6 are partially enlarged cross-sectional views, corresponding to the partially enlarged cross-sectional view of FIG. 3, to describe modified examples of the plurality of data storage patterns 40. In this case, a data storage pattern of any one of the plurality of data storage patterns 40 will be mainly described.

In a modified example, referring to FIG. 5, at least a portion of a plurality of data storage patterns 40 may further include a void 40v between a first side surface 40S1 and a second side surface 40S2. A distance between the void 40v and the first side surface 40S1 may be greater than a distance between the void 40v and the second side surface 40S2. For example, the void 40v may be closer to the second side surface 40S2 than to the first side surface 40S1. In some embodiments, the void 40v may include air. The term "air" as discussed herein, may refer to atmospheric air, or other gases that may be present during the manufacturing process.

In a modified example, referring to FIG. 6, any one of data storage patterns 40' may have a concave upper surface 40U' and a concave lower surface 40L', in a similar manner to those described above. The data storage pattern 40' may have a first side surface 40S1' facing any one of gate layers 65, and a second side surface 40S2' facing a channel semiconductor layer 44.

In an example, a distance between an upper end and a lower end of the first side surface 40S1' may be greater than a distance between an upper end and a lower end of the second side surface 40S2'.

The data storage pattern 40' may include a first portion 40p1' adjacent to the first side surface 40S1', a second portion 40p2' adjacent to the second side surface 40S2', and a minimum vertical thickness portion 40p3' between the first portion 40p1' and the second portion 40p2'. The minimum vertical thickness portion 40p3' may have a thickness less than a maximum vertical thickness of the first portion 40p1' and a maximum vertical thickness of the second portion 40p2'.

A distance between the minimum vertical thickness portion 40p3' and the first side surface 40S1' may be greater than a distance between the minimum vertical thickness portion 40p3' and the second side surface 40S2'. For example, the minimum vertical thickness portion 40p3' may be nearer to the second side surface 40S2' than to the first side surface 40S1'.

The data storage pattern 40' may further include a void 40v' between the first side surface 40S1' and the second side surface 40S2'. A distance between the void 40v' and the first side surface 40S1' may be less than a distance between the void 40v' and the second side surface 40S2'. For example, the void 40v' may be closer to the first side surface 40S1' than to the second side surface 40S2'.

Figure 7:
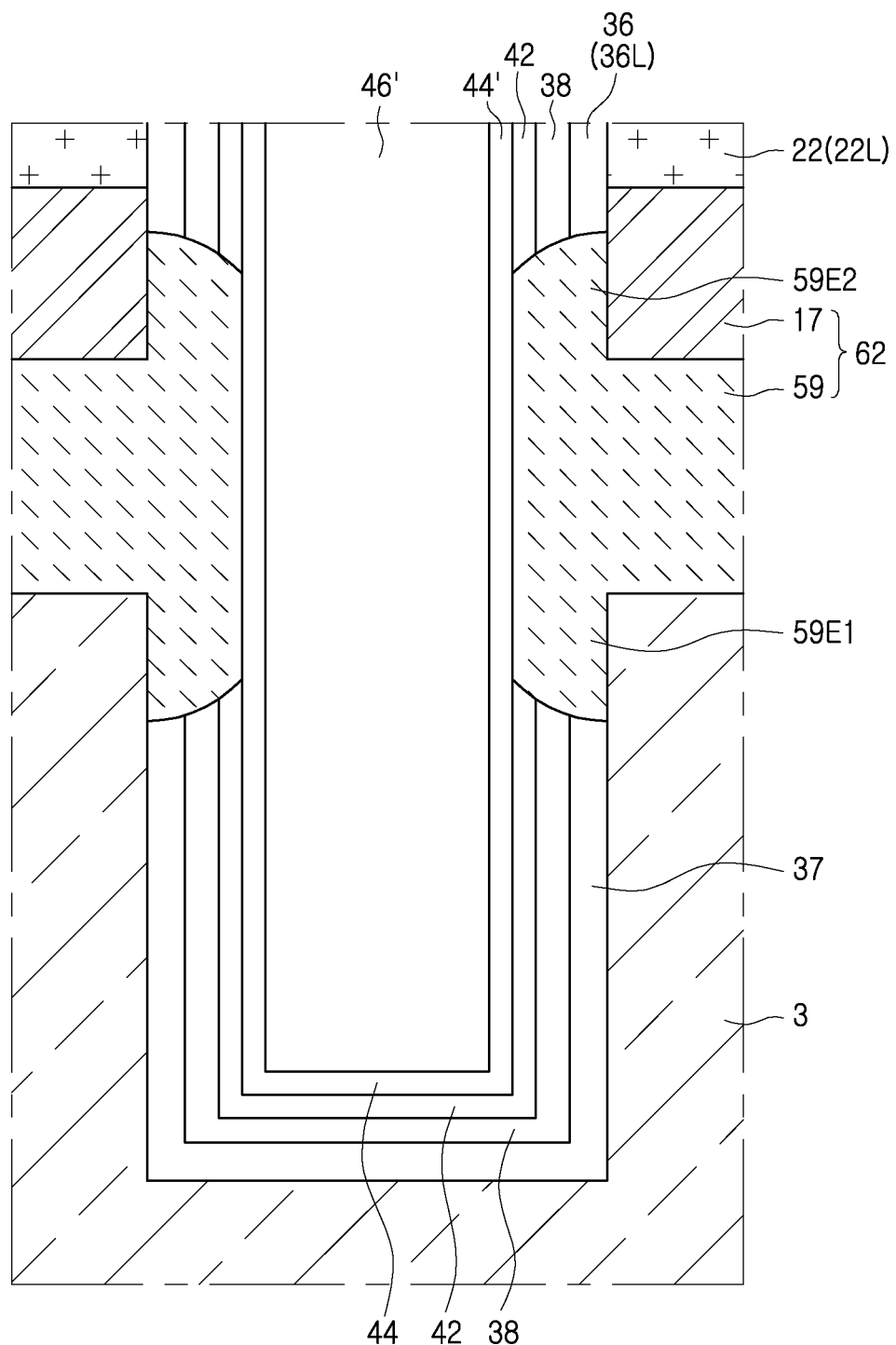
FIG. 7 is a partially enlarged view illustrating a modified example of a semiconductor device, according to an example embodiment of the present inventive concept.

Next, a modified example of the insulating core region 46 described above will be described with reference to FIG. 7. FIG. 7 is a partially enlarged cross-sectional view, corresponding to the partially enlarged cross-sectional view of FIG. 4, to illustrate a modified example of the insulating core region 46 described above.

In a modified example, referring to FIG. 7, a portion of an insulating core region 46' facing a horizontal connection structure 62 may have a substantially constant width. Therefore, a channel semiconductor layer 44' between the horizontal connection structure 62 and a side surface of the insulating core region 46' may have a straight linear shape. In such embodiments, the side surface of the lower horizontal connection pattern 59 adjacent to and contacting the channel semiconductor layer 44' may be linear and substantially perpendicular to the upper surface 3s of the lower structure 3.

Figure 8A:
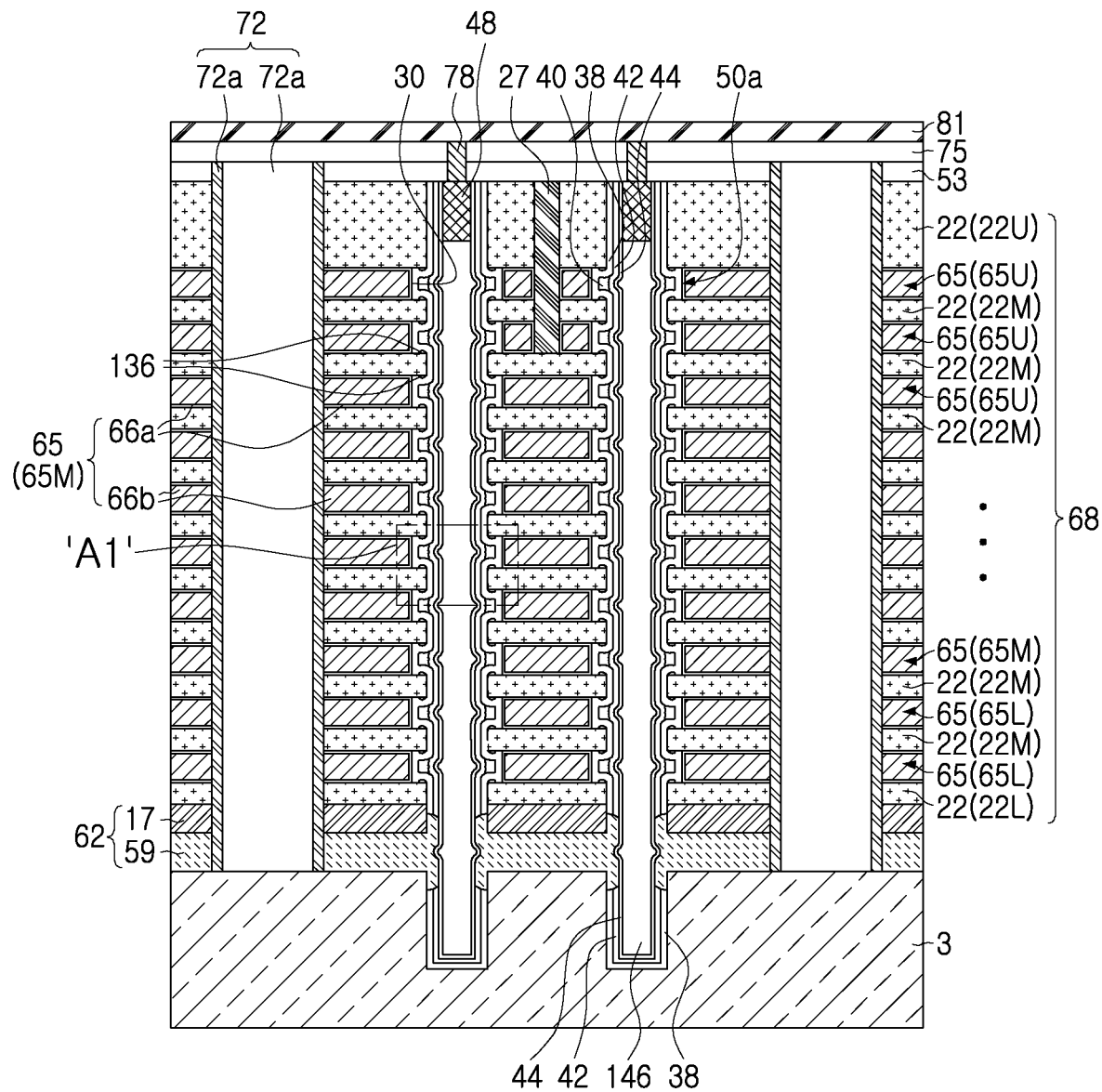
FIG. 8A is a cross-sectional view illustrating a modified example of a semiconductor device, according to an example embodiment of the present inventive concept.
Figure 8B:
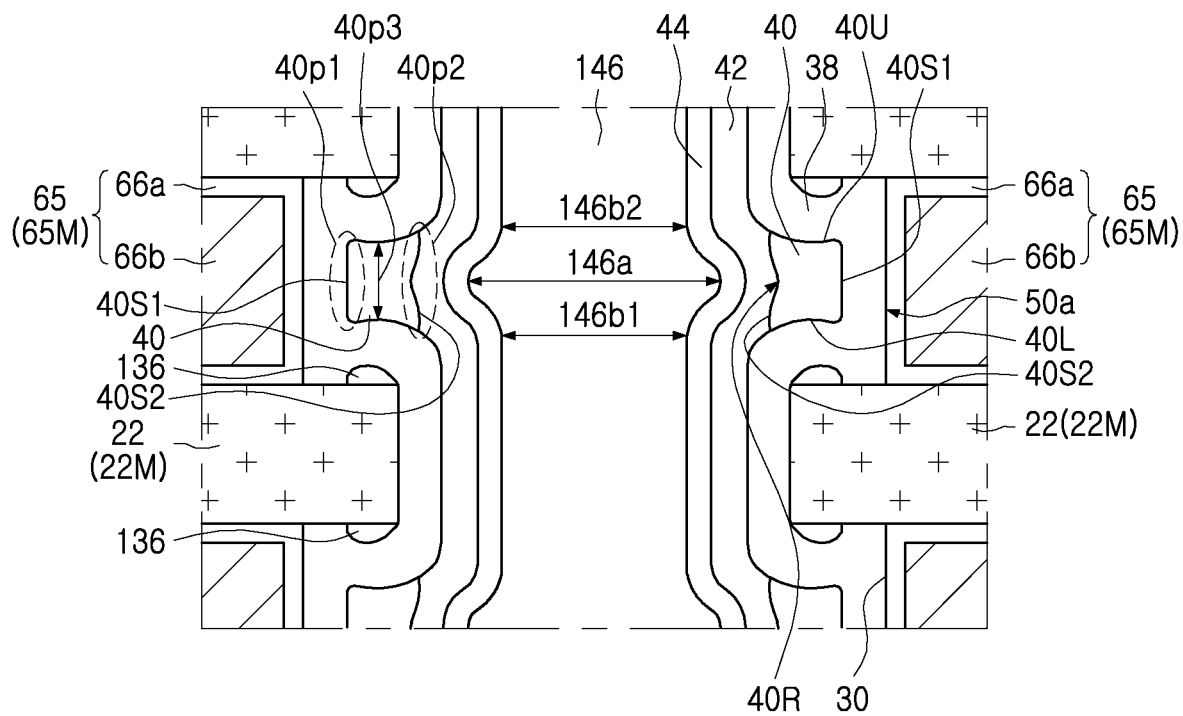
FIG. 8B is a partially enlarged view illustrating portion 'A1' of FIG. 8A.

Next, a modified example of a semiconductor device according to an example embodiment of the present inventive concept will be described with reference to FIGS. 8A and 8B. FIG. 8A is a cross-sectional view illustrating a modified example of a semiconductor device according to an example embodiment of the present inventive concept, and FIG. 8B is a partially enlarged view illustrating portion 'A1' of FIG. 8A. In describing a modified example of a semiconductor device according to an example embodiment of the present inventive concept with reference to FIGS. 8A and 8B, the modified components of the components described with reference to FIGS. 1 to 4 will be mainly described, and non-modified components may be omitted or cited directly.

In a modified example, referring to FIGS. 8A and 8B, a vertical structure 50a may sequentially pass through the stack structure 68 and the horizontal connection structure 62, described above, and may extend into the lower structure 3. The vertical structure 50a may include the first dielectric layer 38, the data storage patterns 40, the second dielectric layer 42, and the channel semiconductor layer 44, and the pad pattern 48, in a substantially same manner to those described with reference to FIGS. 2 to 4. The vertical structure 50a may include an insulating core region 146 having a shape different from that of the insulating core region 46 of FIGS. 2 to 4. For example, the insulating core region 146 of the vertical structure 50a may have convex portions 146a in regions facing the data storage patterns 40, and may not have convex portions in regions facing the interlayer insulating layers 22. The insulating core region 146 may have a substantially constant width in regions facing the interlayer insulating layers 22. For example, a side surface of the insulating core region 146 adjacent to the interlayer insulating layers 22 may be linear and substantially perpendicular to the upper surface 3s of the lower structure 3.

One of the convex portions 146a of the insulating core region 146 may be formed between a first portion 146b1 and a second portion 146b2. A vertical thickness of the convex portion 146a, that is, a distance between the first portion 146b1 and the second portion 146b2 may be less than a thickness of any one of the gate layers 65. For example, the first portion 146b1 may be at a higher vertical level than a lower surface of an adjacent gate layer 65 and the second portion 146b2 may be at a lower vertical level than an upper surface of the adjacent gate layer 65.

The data storage patterns 40 may overlap the interlayer insulating layers 22 in the vertical direction. The reinforcing patterns described with reference to FIGS. 2 to 4 (e.g., the reinforcing patterns 36 of FIGS. 2 to 4) may be modified to be formed on surfaces of the interlayer insulating layers 22 facing the data storage patterns 40. Reinforcing patterns 136, thus modified, may be formed on an upper surface and a lower surface of the interlayer insulating layers 22 facing the data storage patterns 40.

Figure 9:
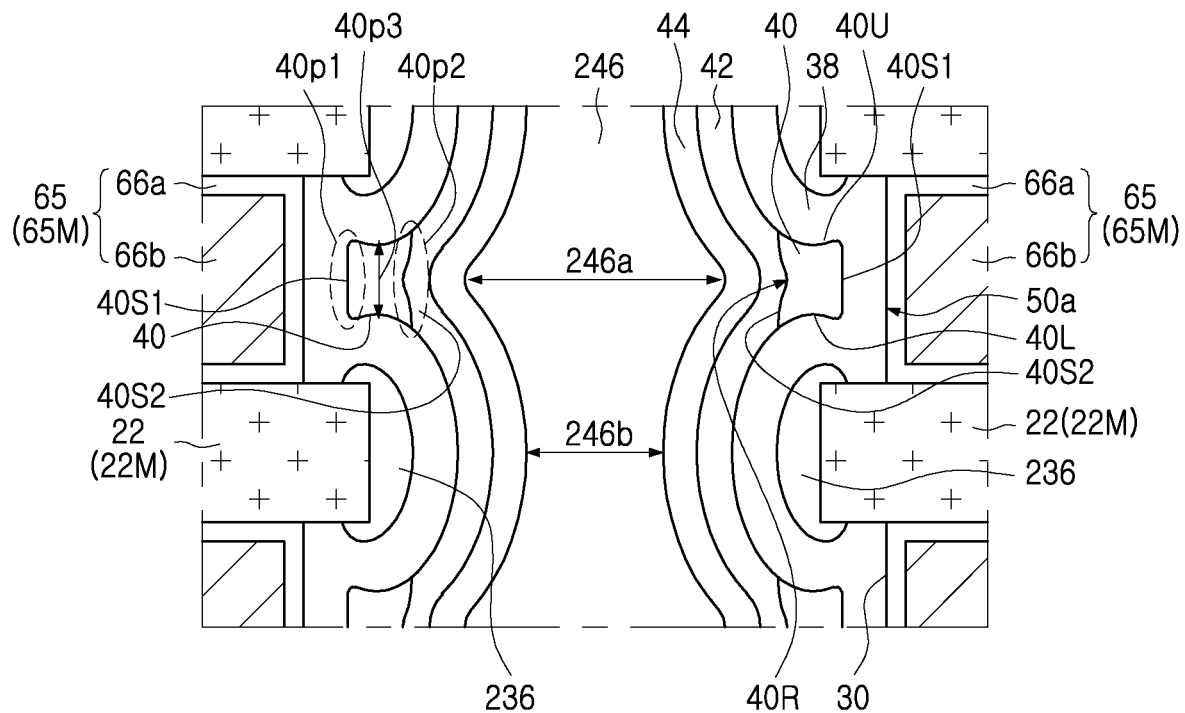
FIG. 9 is a partially enlarged view illustrating a modified example of a semiconductor device, according to an example embodiment of the present inventive concept.

Next, a modified example of the insulating core region 146 and the reinforcing patterns 136 described above with reference to FIGS. 8A and 8B will be described with reference to FIG. 9. FIG. 9 is a partially enlarged cross-sectional view, corresponding to the partially enlarged cross-sectional view of FIG. 8B, to describe modified examples of the insulating core region 146 and the reinforcing patterns 136 described above with reference to FIGS. 8A and 8B.

In a modified example, referring to FIG. 9, a reinforcing pattern 236, having a round shape, may cover a side surface of any one of the interlayer insulating layer 22, and may extend to an upper surface and a lower surface of the interlayer insulating layer 22. An insulating core region 246 may include a convex portion 246a facing the gate layer 65 and a concave portion 246b facing the interlayer insulating layer 22.

Figure 10:
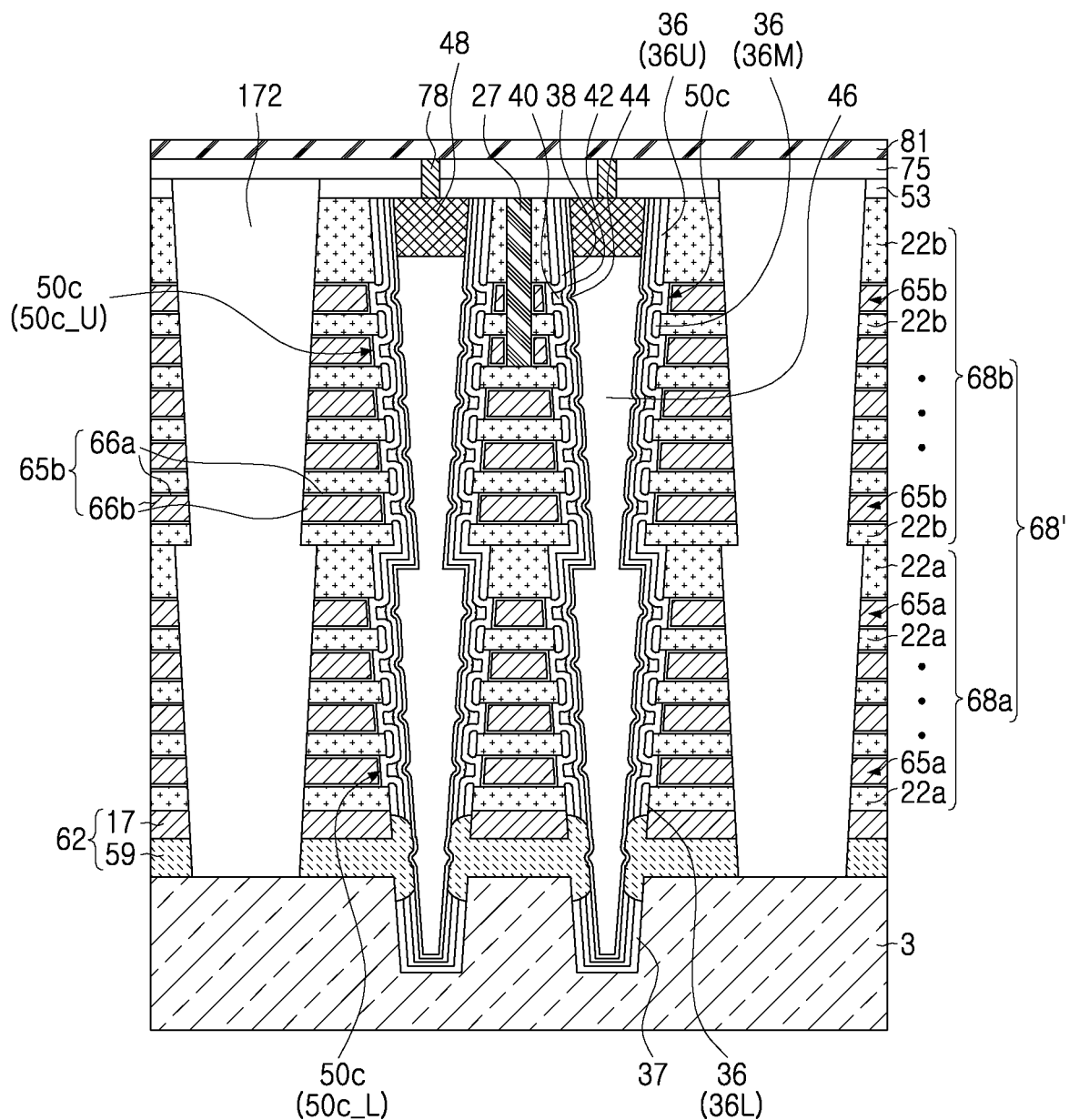
FIG. 10 is a cross-sectional view illustrating a modified example of a semiconductor device, according to an example embodiment of the present inventive concept.

Next, a modified example of a semiconductor device according to an example embodiment of the present inventive concept will be described with reference to FIG. 10. FIG. 10 is a cross-sectional view illustrating a modified example of a semiconductor device according to an example embodiment of the present inventive concept. In this case, modified portions in the semiconductor device according to the example embodiment, described above with reference to FIGS. 2 to 4, will be mainly described.

Referring to FIG. 10, the lower structure 3 and the horizontal connection structure 62 may be provided in a substantially same manner to those described with reference to FIGS. 2 to 4. The stack structure of FIG. 2 (e.g., the stack structure 68 of FIG. 2) may be modified into a stack structure 68' including a lower stack group 68a, and an upper stack group 68b on the lower stack group 68a. The lower stack group 68a may include lower interlayer insulating layers 22a and lower gate layers 65a, alternately and repeatedly stacked. The upper stack group 68b may include upper interlayer insulating layers 22b and upper gate layers 65b, alternately and repeatedly stacked. The lower and upper interlayer insulating layers 22a and 22b may be formed of the same material, for example, silicon oxide. The lower and upper gate layers 65a and 65b may be formed of the same material and structure. For example, each of the lower and upper gate layers 65a and 65b may include a first layer 66a and a second layer 66b. The first and second layers 66a and 66b may be substantially the same as those described with reference to FIGS. 2 to 4.

A vertical structure 50c may be disposed to sequentially pass through the stack structure 68 and the horizontal connection structure 62, and may extend into the lower structure 3.

The vertical structure 50c may include a lower portion 50c_L, and an upper portion 50c_U on the lower portion 50c_L.

In the vertical structure 50c, a width of a lower region of the upper portion 50c_U, adjacent to the lower portion 50c_L, may be less than a width of an upper region of the lower portion 50c_L, adjacent to the upper portion 50c_U.

The vertical structure 50c may include substantially the same components as those described above with reference to FIGS. 2 to 4 (e.g., the components described above in connection with the vertical structure 50 of FIGS. 2 to 4). For example, the vertical structure 50c may include the first dielectric layer 38, the data storage patterns 40, the second dielectric layer 42, the channel semiconductor layer 44, the insulating core region 46, and the pad pattern 48, described above with reference to FIGS. 2 to 4.

A first upper insulating layer 53 and a second upper insulating layer 75, sequentially stacked on the stack structure 68', may be arranged. A separation structure 172 passing through the first upper insulating layer 53, the stack structure 68', and the horizontal connection structure 62 may be disposed. The separation structure 172 may be comprised of upper and lower portions, and side surfaces of the upper and lower portions of the separation structure 172 may have an angle with respect to the upper surface 3s of the lower structure 3. The separation structure 172 may be formed of an insulating material such as silicon oxide, or the like.

Figure 11:
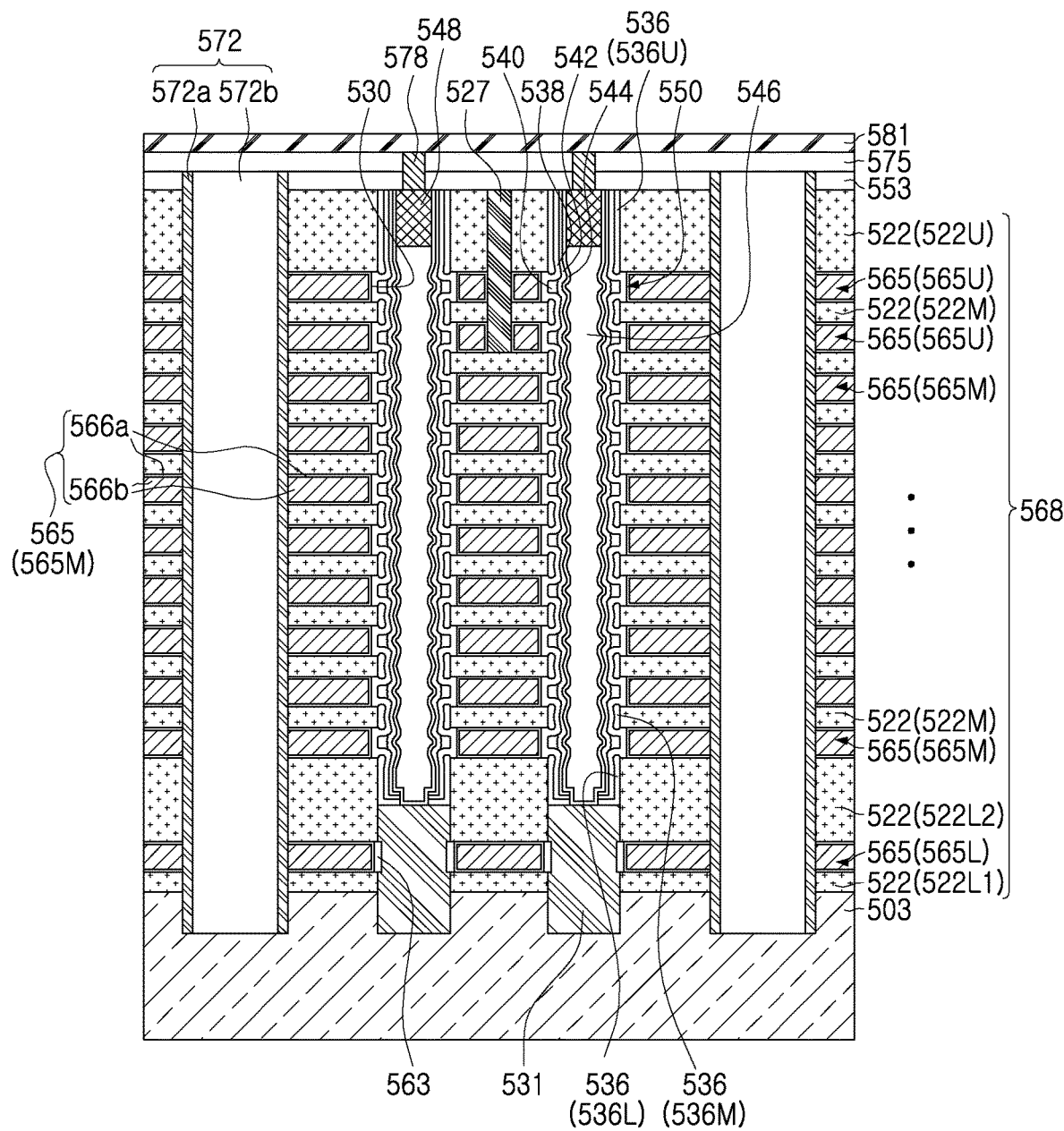
FIG. 11 is a cross-sectional view illustrating a modified example of a semiconductor device, according to an example embodiment of the present inventive concept.

Next, referring to FIG. 11, a modified example of the semiconductor device according to an example embodiment will be described. FIG. 11 is a cross-sectional view illustrating a modified example of a semiconductor device according to an example embodiment of the present inventive concept.

Referring to FIG. 11, a stack structure 568 may be disposed on a lower structure 503. The lower structure 503 may include a semiconductor substrate. The stack structure 568 may include interlayer insulating layers 522 and gate layers 565, alternately and repeatedly stacked.

The interlayer insulating layers 522 may include a first lower interlayer insulating layer 522L1, a second lower interlayer insulating layer 522L2 on the first lower interlayer insulating layer 522L1, intermediate interlayer insulating layers 522M on the second lower interlayer insulating layer 522L2, and an upper interlayer insulating layer 522U on the intermediate interlayer insulating layers 522M.

Each of the gate layers 565 may include a first layer 566a and a second layer 566b. The first layer 566a and the second layer 566b may correspond to the first layer 66a and the second layer 66b, respectively, as described with reference to FIGS. 2 to 4. Therefore, the gate layers 565 may be formed of substantially the same material and have the same structure as the gate layers described with reference to FIGS. 2 to 4 (e.g., the gate layers 65 of FIGS. 2 to 4).

The gate layers 565 may include a lower gate layer 565L between the first lower interlayer insulating layer 522L1 and the second lower interlayer insulating layer 522L2, intermediate gate layers 565M on the lower gate layer 565L, and one or a plurality of upper gate layers 565U on the intermediate gate layers 565M.

An insulating pattern 527 passing through the upper interlayer insulating layer 522U, extending in the downward direction (e.g., toward an upper surface of the lower structure 503), and passing through the one or the plurality of upper gate layers 565U may be disposed.

An opening 530 passing through the stack structure 568 and exposing the lower structure 503 may be disposed. A vertical structure 550 may be disposed in the opening 530. The vertical structure 550 may pass through the stack structure 568, and may extend into the lower structure 503.

The vertical structure 550 may include a lower semiconductor pattern 531, an insulating core region 546, a pad pattern 548, a channel semiconductor layer 544, a first dielectric layer 538, a second dielectric layer 542, and data storage patterns 540.

The lower semiconductor pattern 531 may be in contact with the lower structure 503. The lower semiconductor pattern 531 may face the lower gate layer 565L, and may be disposed on a lower level than the intermediate gate layers 565M. The insulating core region 546 may partially fill the opening 530 on the lower semiconductor pattern 531. The pad pattern 548 may be disposed on the insulating core region 546. The channel semiconductor layer 544 may cover a lower surface and a side surface of the insulating core region 546, and may be connected to the pad pattern 548. The channel semiconductor layer 544 may be connected to the lower semiconductor pattern 531.

The first dielectric layer 538 may be disposed between the channel semiconductor layer 544 and the stack structure 568 on the lower semiconductor pattern 531. The second dielectric layer 542 may be disposed between the channel semiconductor layer 544 and the first dielectric layer 538 on the lower semiconductor pattern 531. The data storage patterns 540 may face the intermediate and upper gate layers 565M and 565U on the lower semiconductor pattern 531, and may be disposed between the first dielectric layer 538 and the second dielectric layer 542.

A cross-sectional structure of the vertical structure 550, adjacent to the intermediate and upper gate layers 565M and 565U and the intermediate and upper interlayer insulating layers 522M and 522U, may be substantially the same as the cross-sectional structure of the vertical structure 50 of, for example, FIG. 2, adjacent to the gate layers 65 of, for example, FIG. 2 and the intermediate and upper interlayer insulating layers 22M and 22U of, for example, FIG. 2. Therefore, the cross-sectional structure of the vertical structure 550 may be substantially the same as the cross-sectional structure of the vertical structure 50, described with reference to FIG. 2 and FIG. 3, in which portion 'A' of FIG. 2 is enlarged.

Reinforcing patterns 536 adjacent to the vertical structure 550 may be disposed. The reinforcing patterns 536 may be formed of an insulating material such as silicon oxide, or the like. In an example, the reinforcing patterns 536 may include a lower reinforcing pattern 536L interposed between the second lower interlayer insulating layer 522L2 and the vertical structure 550 and contacting a portion of an upper surface of the lower semiconductor pattern 531, an upper reinforcing pattern 536U interposed between the upper interlayer insulating layer 522U and the vertical structure 550, and intermediate reinforcing patterns 536M interposed between the intermediate interlayer insulating layers 522M and the vertical structure 550.

A first upper insulating layer 553 and a second upper insulating layer 575 may be sequentially arranged on the stack structure 568. Separation structures 572 passing through the first upper insulating layer 553 and the stack structure 568 may be disposed. Each of the separation structures 572 may include a separation spacer 572a and a separation pattern 572b. The separation spacer 572a may be disposed on a side surface of the separation pattern 572b. In an example, the separation spacer 572a may be formed of an insulating material, and the separation pattern 572b may be formed of a conductive material. In another example, the separation structures 572 may be formed of an insulating material.

Conductive lines 581 may be disposed on the second upper insulating layer 575. A contact plug 578 may be disposed between the conductive line 581 and the vertical structure 550.

Figure 12:
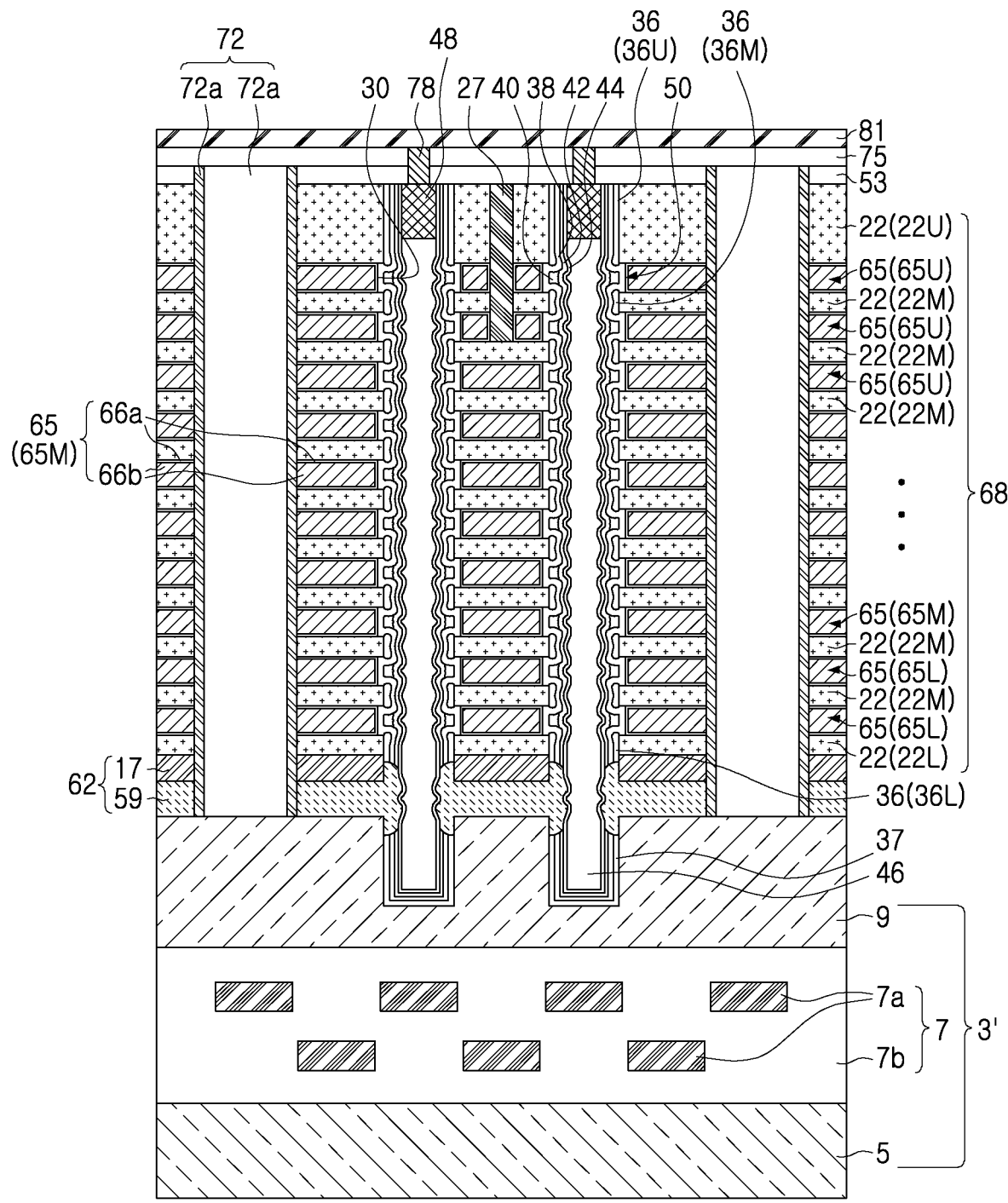
FIG. 12 is a cross-sectional view illustrating a modified example of a semiconductor device, according to an example embodiment of the present inventive concept.

Next, a modified example of the lower structure 3 described above will be described with reference to FIG. 12. FIG. 12 is a cross-sectional view illustrating a modified example of a semiconductor device according to an example embodiment of the present inventive concept.

In a modified example, referring to FIG. 12, the lower structure (e.g., the lower structure 3 of FIG. 2) described above in FIG. 2 may be replaced by a lower structure 3' including a lower substrate 5, a peripheral circuit region 7 on the lower substrate 5, and an upper substrate 9 on the peripheral circuit region 7. The lower substrate 5 may be a semiconductor substrate. The peripheral circuit region 7 may include a peripheral circuit wiring 7a, and a peripheral insulating layer 7b covering the peripheral circuit wiring 7a. The upper substrate 9 may be a conductive substrate. For example, the upper substrate 9 may include polysilicon and/or a metal material, having N-type conductivity.

Next, an example of a method of forming a semiconductor device according to an example embodiment of the present inventive concept will be described with reference to FIGS. 13A to 13F. FIGS. 13A to 13F are cross-sectional views illustrating regions taken along cross-sectional line I-I' of FIG. 1 to illustrate an example of a method of forming a semiconductor device according to an example embodiment of the present inventive concept.

Figure 13A:
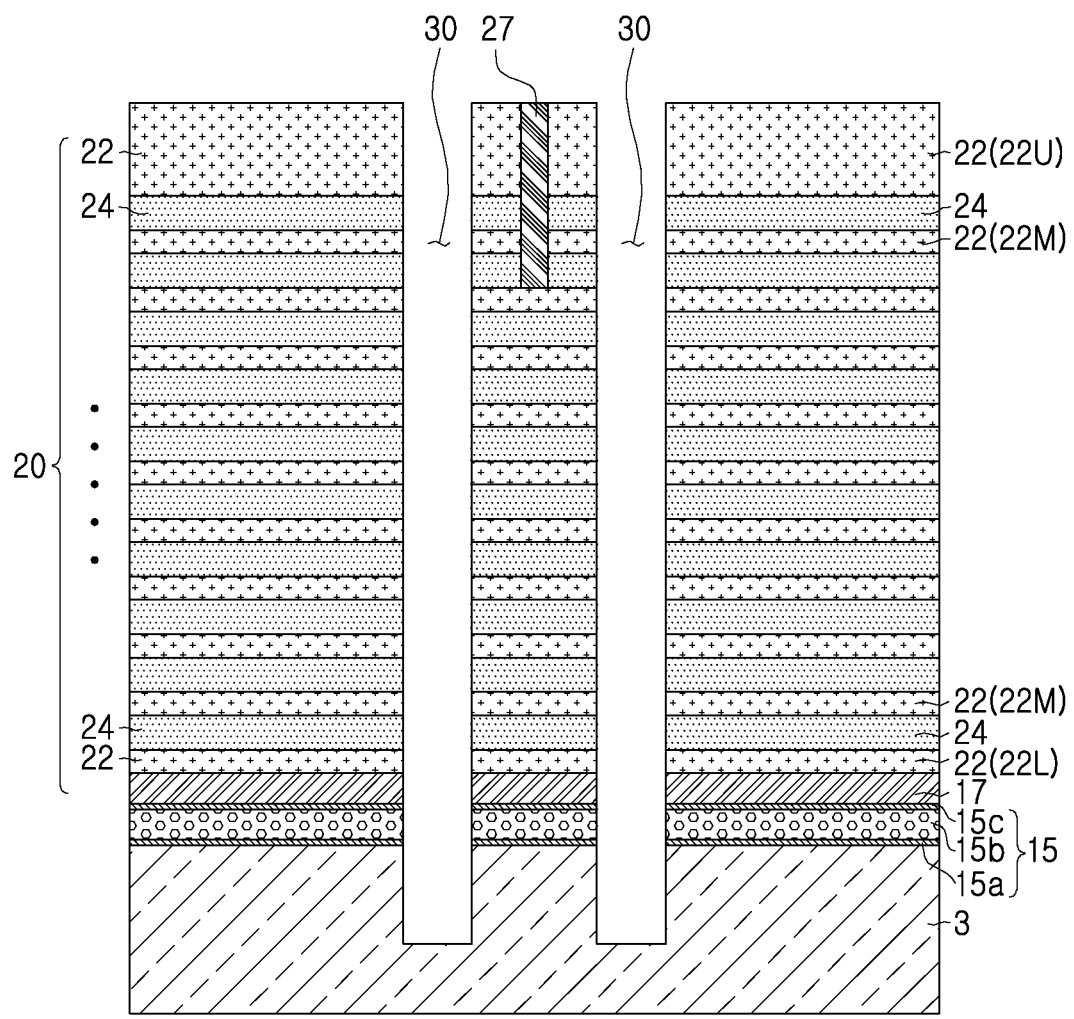
FIGS. 13A to 13F are cross-sectional views illustrating an example of a method of forming a semiconductor device, according to an example embodiment of the present inventive concept.

Referring to FIGS. 1 and 13A, a lower horizontal mold layer 15 and an upper horizontal connection pattern 17 may be sequentially formed on a lower structure 3. The lower horizontal mold layer 15 may include a first lower horizontal mold layer 15a, a second lower horizontal mold layer 15b, and a third lower horizontal mold layer 15c, sequentially stacked.

In an example, the first and third lower horizontal mold layers 15a and 15c may be formed of a first material (e.g., silicon oxide), and the second lower horizontal mold layer 15b may be formed of a second material (e.g., silicon nitride or polysilicon) different than those of the first and third lower horizontal mold layers 15a and 15c.

The upper horizontal connection pattern 17 may be formed of polysilicon. For example, the upper horizontal connection pattern 17 may be formed of polysilicon having N-type conductivity.

A mold structure 20 may be formed on the upper horizontal connection pattern 17.

The mold structure 20 may include a plurality of interlayer insulating layers 22 and a plurality of sacrificial gate layers 24, alternately and repeatedly stacked. The plurality of interlayer insulating layers 22 may include a lowermost interlayer insulating layer 22L, a plurality of intermediate interlayer insulating layers 22M on the lowermost interlayer insulating layer 22L, and an uppermost interlayer insulating layer 22U on the plurality of intermediate interlayer insulating layers 22M. The plurality of sacrificial gate layers 24 may be formed between the lowermost interlayer insulating layer 22L and the uppermost interlayer insulating layer 22U.

The plurality of interlayer insulating layers 22 may be formed of silicon oxide, and the plurality of sacrificial gate layers 24 may be formed of a material having etch selectivity with the plurality of interlayer insulating layers 22, for example, silicon nitride.

An insulating pattern 27 passing through the uppermost interlayer insulating layer 22U, extending in a downward direction (e.g., toward the upper surface 3s of the lower structure 3), and passing through one or a plurality of upper sacrificial gate layers of the sacrificial gate layers 24 may be formed. The insulating pattern 27 may be formed of silicon oxide.

An opening 30 passing through the mold structure 20, extending in a downward direction (e.g., toward the upper surface 3s of the lower structure 3), sequentially passing through the upper horizontal connection pattern 17 and the lower horizontal mold layer 15, and extending into the lower structure 3 may be formed. The opening 30 may be formed in plural (e.g., a plurality of openings 30). In some embodiments, when viewed in plan view, each of the openings 30 may have a circular shape, an elliptical shape, an oval shape, etc.

Figure 13B:
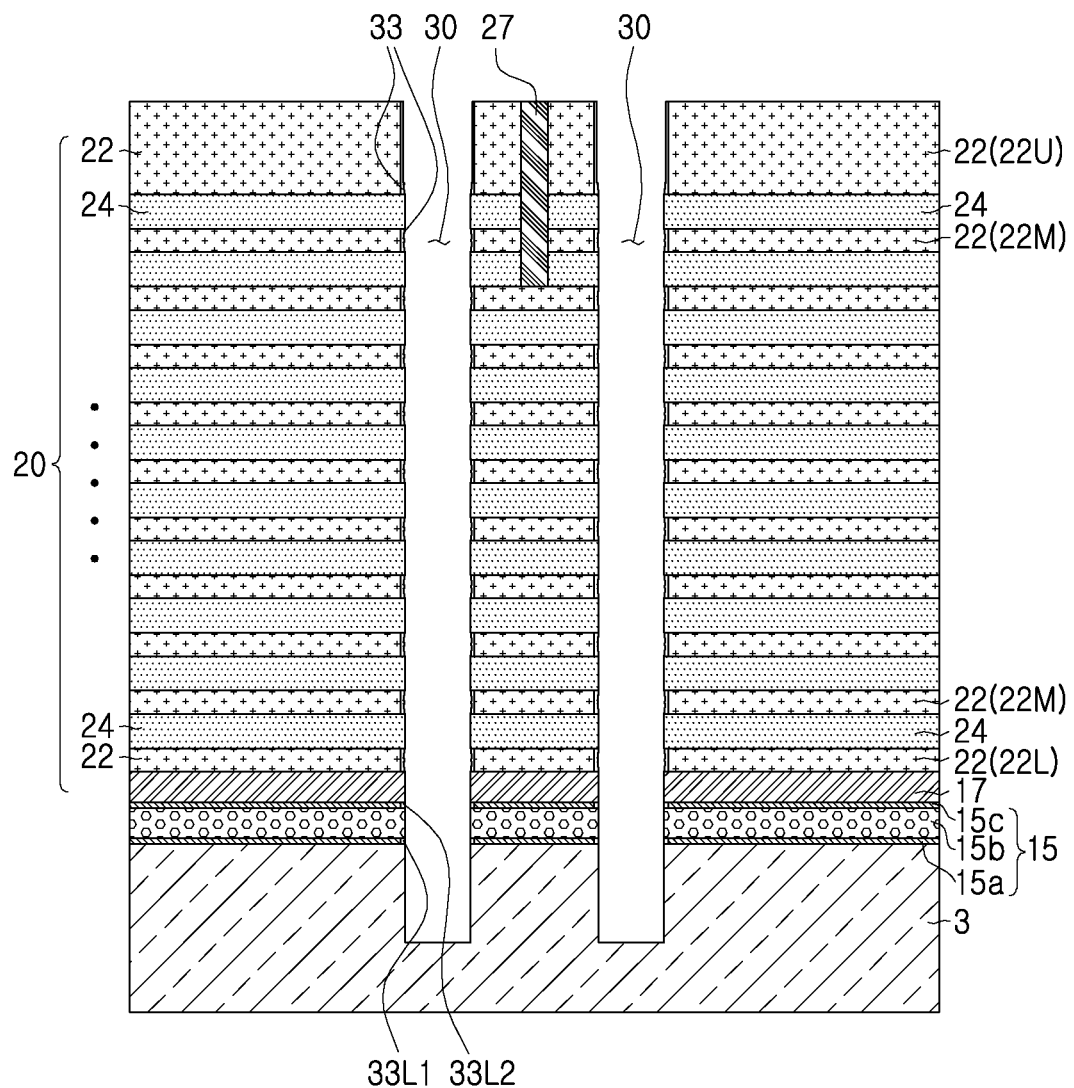

Referring to FIGS. 1 and 13B, the interlayer insulating layers 22 may be etched, and preliminary reinforcing layers 33 may be formed on side surfaces of the interlayer insulating layers 22. The preliminary reinforcing layers 33 may be formed of polysilicon.

When the first and third lower horizontal mold layers 15a and 15c and the interlayer insulating layers 22 are formed of the same material, the first and third lower horizontal mold layers 15a and 15c may be etched along with etching of the interlayer insulating layers 22, a first lower preliminary reinforcing layer 33L1 may be formed on a side surface of the first lower horizontal mold layer 15a, and a second lower preliminary reinforcing layer 33L2 may be formed on a side surface of the third lower horizontal mold layer 15c.

Figure 13C:
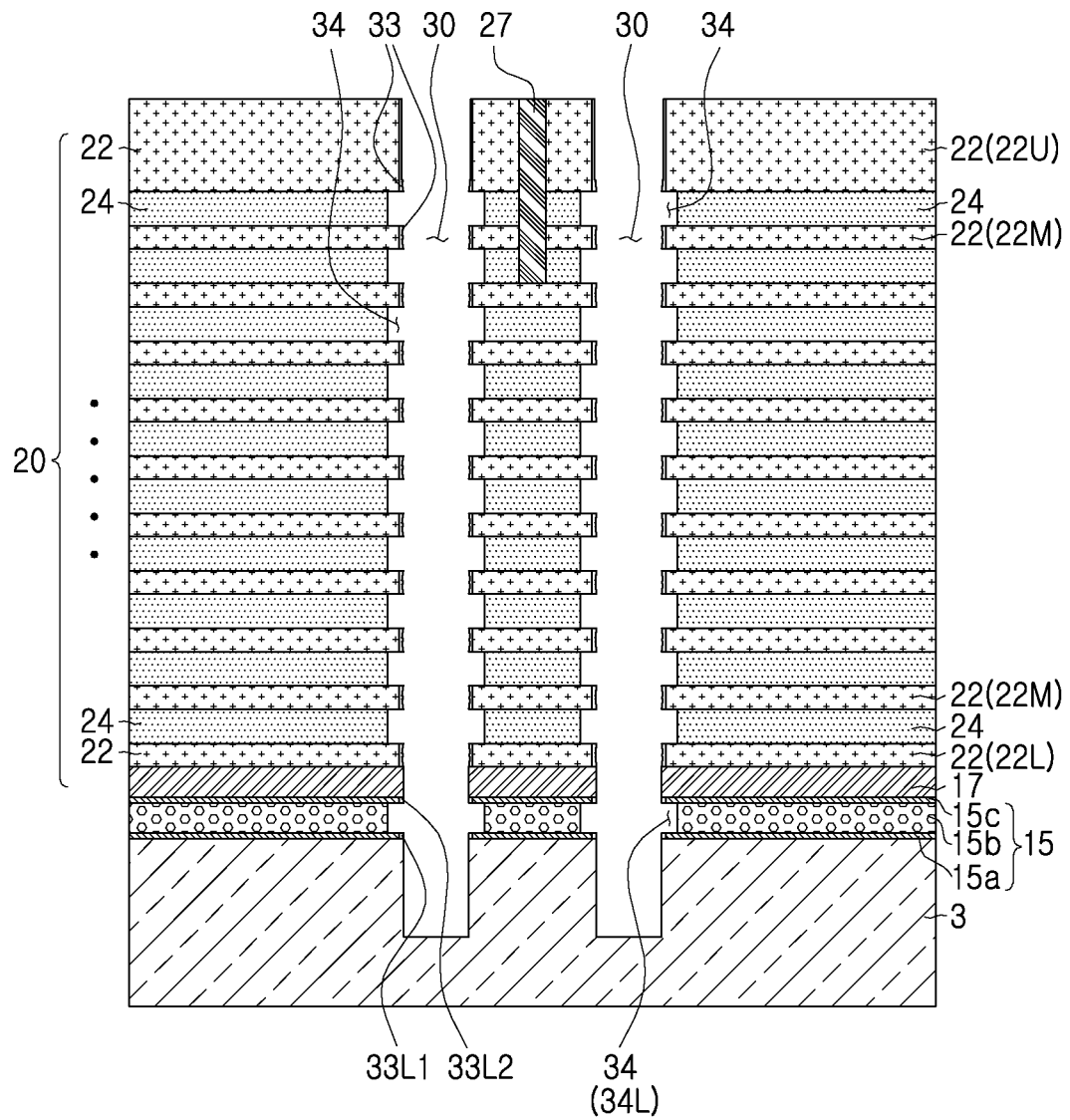

Referring to FIGS. 1 and 13C, the sacrificial gate layers 24 may be selectively etched to form recess regions 34.

In an example, when the second lower horizontal mold layer 15b and the sacrificial gate layers 24 are formed of the same material, for example silicon nitride, the second lower horizontal mold layer 15b may be etched, together with the sacrificial gate layers 24, to form a lowermost recess region 34L.

In another example, when the second lower horizontal mold layer 15b is formed of a material different from the sacrificial gate layers 24, for example polysilicon, the second lower horizontal mold layer 15b may not be substantially etched during the selective etching of the sacrificial gate layers 24.

Hereinafter, for convenience of description, an example in which the second lower horizontal mold layer 15b is formed of the same material as the sacrificial gate layers 24 will be mainly described.

Figure 13D:
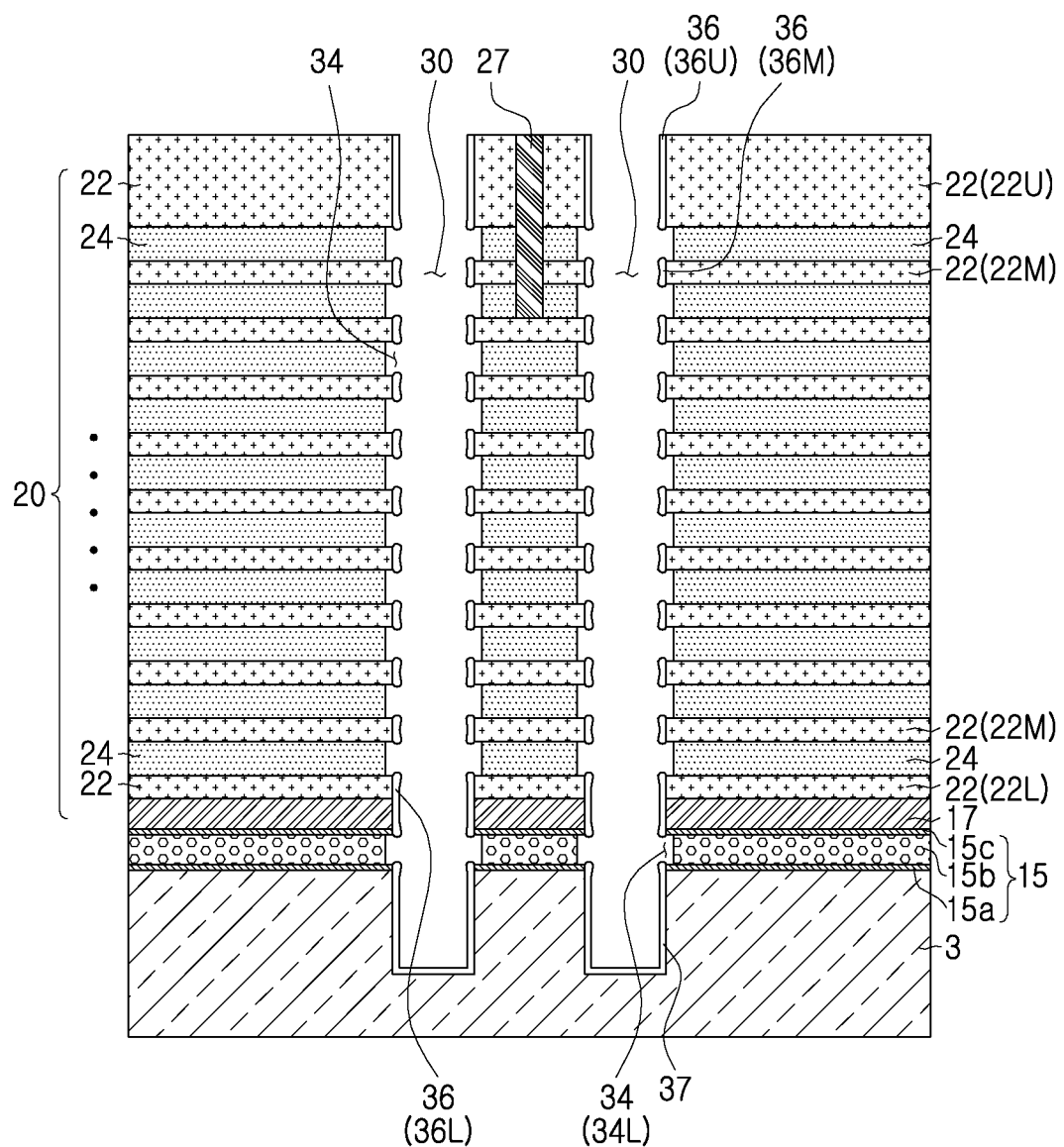

Referring to FIGS. 1 and 13D, an oxidation process may be performed to form reinforcing patterns 36 and a substrate insulating layer 37. The oxidation process may be a process of oxidizing silicon to form silicon oxide.

The oxidation process may be a process of oxidizing the preliminary reinforcing layers (e.g., the preliminary reinforcing layers 33 of FIG. 13C), the first and second lower preliminary reinforcing layers (e.g., the first and second lower preliminary reinforcing layers 33L1 and 33L2 of FIG. 13C), the upper horizontal connection pattern 17, and the lower structure 3, to form silicon oxide.

The reinforcing patterns 36 may include an upper reinforcing pattern 36U, intermediate reinforcing patterns 36M, and a lower reinforcing pattern 36L. The upper reinforcing pattern 36U may be formed by oxidizing the preliminary reinforcing layer (e.g., the preliminary reinforcing layer 33 of FIG. 13C) on side surfaces of the uppermost interlayer insulating layer 22U. The intermediate reinforcing patterns 36M may be formed by oxidizing the preliminary reinforcing layers (e.g., the preliminary reinforcing layers 33 of FIG. 13C) on side surfaces of the intermediate interlayer insulating layers 22M. The lower reinforcing pattern 36L may be formed by oxidizing the preliminary reinforcing layer (e.g., the preliminary reinforcing layer 33 of FIG. 13C), the upper horizontal connection pattern 17, and the second lower preliminary reinforcing layer (e.g., the second lower preliminary reinforcing layer 33L2 of FIG. 13C) on side surfaces of the lowermost interlayer insulating layer 22L. The substrate insulating layer 37 may be formed by oxidizing a surface of the lower structure 3 exposed by the opening 30 and the first lower preliminary reinforcing layer (e.g., the first lower preliminary reinforcing layer 33L1 of FIG. 13C).

Therefore, the reinforcing patterns 36 and the substrate insulating layer 37, as described with reference to FIGS. 2 to 4, may be formed.

In another example, the reinforcing patterns 36 may be formed by replacing the reinforcing patterns (e.g., the reinforcing patterns 136 of FIGS. 8A and 8B) of FIGS. 8A and 8B. For example, after forming the openings (e.g., the openings 30 of FIG. 13A) as in FIG. 13A, the sacrificial gate layers (e.g., the sacrificial gate layers 24 of FIG. 13C) may be etched and recessed, and the reinforcing patterns (e.g., the reinforcing patterns 136 of FIGS. 8A and 8B) as in FIGS. 8A and 8B may be formed on surfaces of the interlayer insulating layers 22 exposed during etching the sacrificial gate layers (e.g., the sacrificial gate layers 24 of FIG. 13C). The reinforcing patterns 136 of FIGS. 8A and 8B may be formed by an insulating by-product generated by etching the sacrificial gate layers (e.g., the sacrificial gate layers 24 of FIG. 13C).

In another example, the reinforcing patterns 36 may be formed by being replaced with the reinforcing patterns (e.g., the reinforcing patterns 236 of FIG. 9). For example, after forming the openings (e.g., the openings 30 of FIG. 13A) as in FIG. 13A, the sacrificial gate layers (e.g., the sacrificial gate layers 24 of FIG. 13C) may be etched and recessed, and an oxide layer having a low step coverage covering the side surfaces of the interlayer insulating layers 22 exposed during etching the sacrificial gate layers (e.g., the sacrificial gate layers 24 of FIG. 13C) may be deposited to form reinforcing patterns (e.g., the reinforcing patterns 236 of FIG. 9) as described in FIG. 9.

Figure 13E:
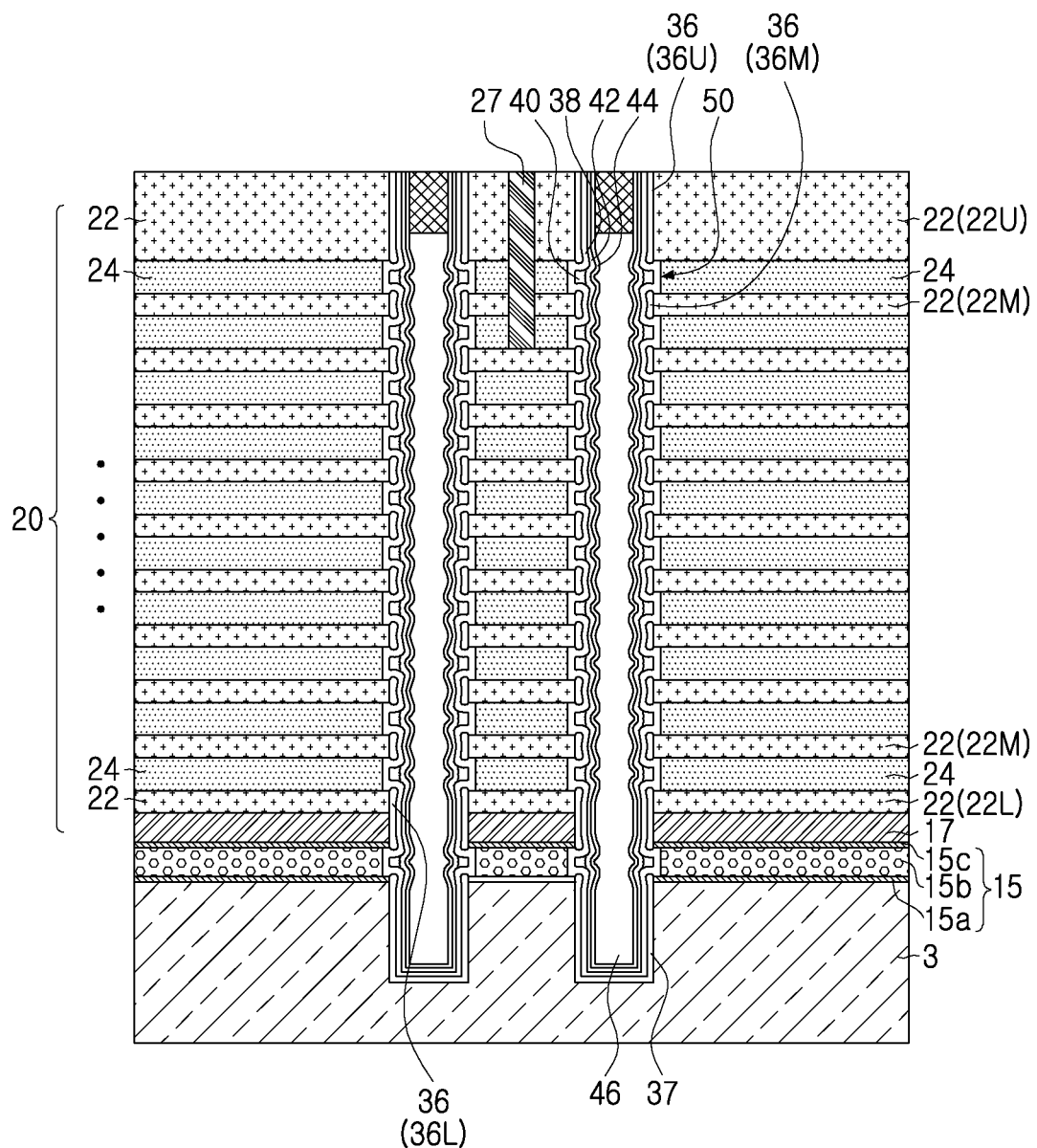

Referring to FIGS. 1 and 13E, a vertical structure 50 may be formed in the opening 30 in which the reinforcing patterns 36 and the substrate insulating layer 37 are formed. The formation of the vertical structure 50 may include forming a first dielectric layer 38 conformally covering an internal wall of the opening 30, forming a plurality of data storage patterns 40 defined in the recess regions 34 on the first dielectric layer 38, conformally forming a second dielectric layer 42, conformally forming a channel semiconductor layer 44, forming an insulating core region 46 on the channel semiconductor layer 44 that partially fills the opening 30, and forming a pad pattern 48 on the insulating core region 46.

The formation of the plurality of data storage patterns 40 may include forming a data storage layer on the first dielectric layer 38 that covers the inner wall of the opening 30 and fills the recess regions 34, and partially etching the data storage layer to remain the data storage layer in the recess regions 34.

Figure 13F:
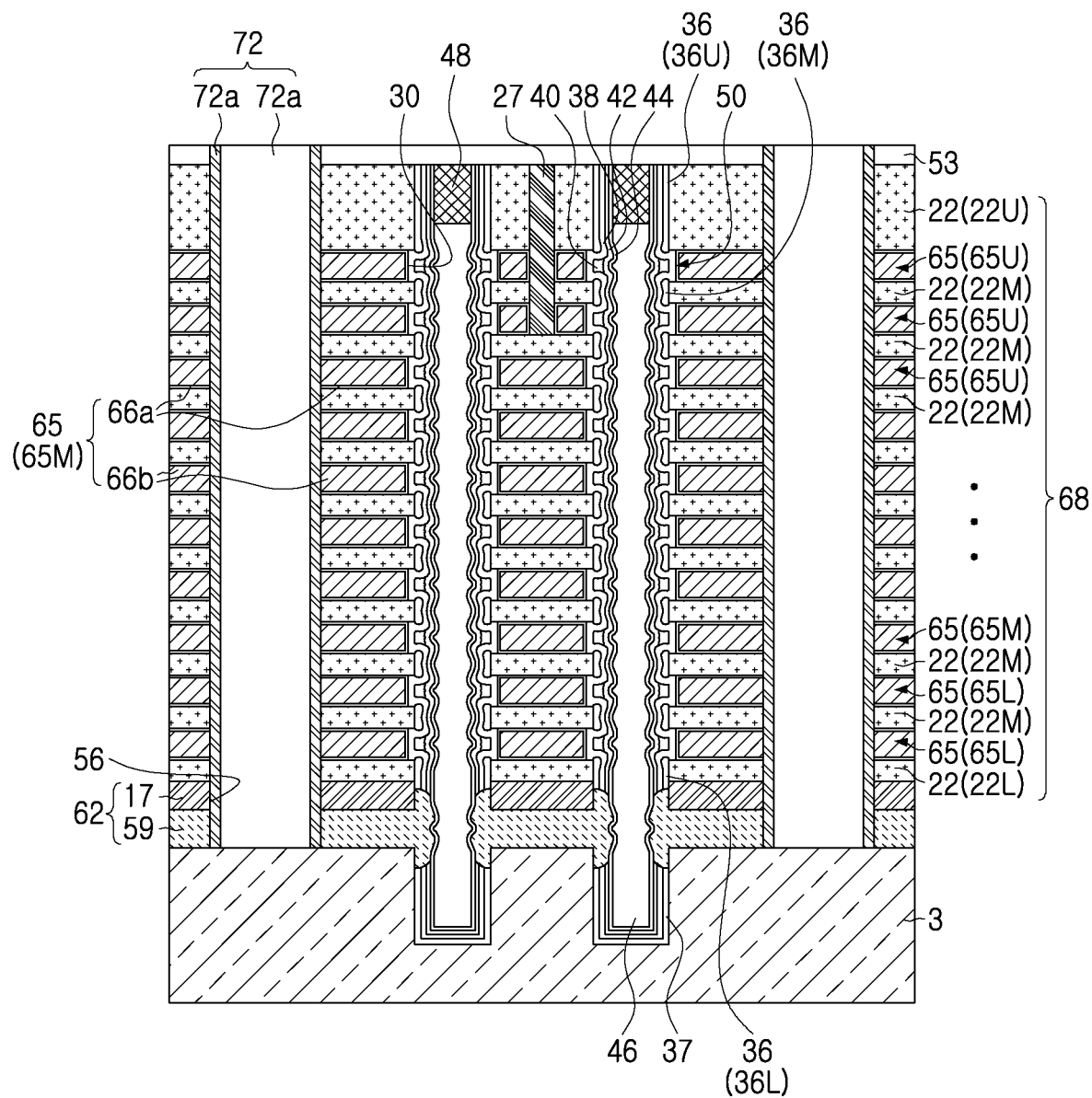

Referring to FIGS. 1 and 13F, a first upper insulating layer 53 may be formed on the mold structure (e.g., the mold structure 20 of FIG. 13E). A lower horizontal connection pattern 59 may be connected to the channel semiconductor layer 44, while replacing the lower horizontal mold layer (e.g., the lower horizontal mold layer 15 of FIG. 13E) with the lower horizontal connection pattern 59. For example, a preliminary trench passing through the first upper insulating layer 53, the mold structure (e.g., the mold structure 20 of FIG. 13E), the upper horizontal connection pattern 17, and the third lower horizontal mold layer (e.g., the third lower horizontal mold layer 15c of FIG. 13E), and exposing the second lower horizontal mold layer (e.g., the second lower horizontal mold layer 15b of FIG. 13e) may be formed, a sacrificial spacer may be formed on a side wall of the preliminary trench, and the second lower horizontal mold layer (e.g., the second lower horizontal mold layer 15b of FIG. 13E) may be removed. Then, the first lower horizontal mold layer (e.g., first lower horizontal mold layer 15a of FIG. 13E), the third lower horizontal mold layer (e.g., the third lower horizontal mold layer 15c of FIG. 13E), the first dielectric layer 38 disposed between the lower horizontal mold layer (e.g., lower horizontal mold layer 15 of FIG. 13E) and the channel semiconductor layer 44, the data storage pattern of any one of the data storage patterns 40, and the second dielectric layer 42 may be sequentially etched, and a portion of the lower reinforcing pattern 36L and a portion of the substrate insulating layer 37 may be etched, a space between the lower structure 3 and the upper horizontal connection pattern 17 may be filled, the lower horizontal connection pattern 59 contacting the channel semiconductor layer 44 may be formed, and the sacrificial spacer may be removed. The preliminary trench may be formed as a trench 56 exposing the lower structure 3.

In an example, the lower horizontal connection pattern 59 and the upper horizontal connection pattern 17 may constitute a horizontal connection structure 62.

The sacrificial gate layers (e.g., the sacrificial gate layers 24 of FIG. 13E) may be exposed by the trench 56. The sacrificial gate layers (e.g., the sacrificial gate layers 24 of FIG. 13E) exposed by the trench 56 may be replaced with gate layers 65. The formation of the gate layers 65 may include removing the sacrificial gate layers (e.g., the sacrificial gate layers 24 of FIG. 13E) exposed by the trench 56 to form void spaces, forming a first layer 66a conformally covering internal walls of the void spaces, and forming a second layer 66b filling the void spaces on the first layer 66a. Therefore, each of the gate layers 65 may include the first and second layers 66a and 66b. In an example, the first layer 66a may be formed of an insulating material, and the second layer 66b may be formed of a conductive material. In another example, the first and second layers 66a and 66b may be formed of different conductive materials.

The gate layers 65 and the interlayer insulating layers 22 may constitute a stack structure 68.

Subsequently, a separation structure 72 filling the trench 56 may be formed. The separation structure 72 may include a separation spacer 72a on a side wall of the trench 56, and a separation pattern 72b filling the trench 56.

Referring back to FIGS. 1 to 4, a second upper insulating layer 75 may be formed on the separation structure 72 and the first upper insulating layer 53. A contact plug 78 covering the first and second upper insulating layers 53 and 75 may be formed. A conductive line 81 may be formed on the contact plug 78. The conductive line 81 may be a bit line. The conductive line 81 may be electrically connected to the pad pattern 48 of the vertical structure 50 through the contact plug 78.

Figure 14A:
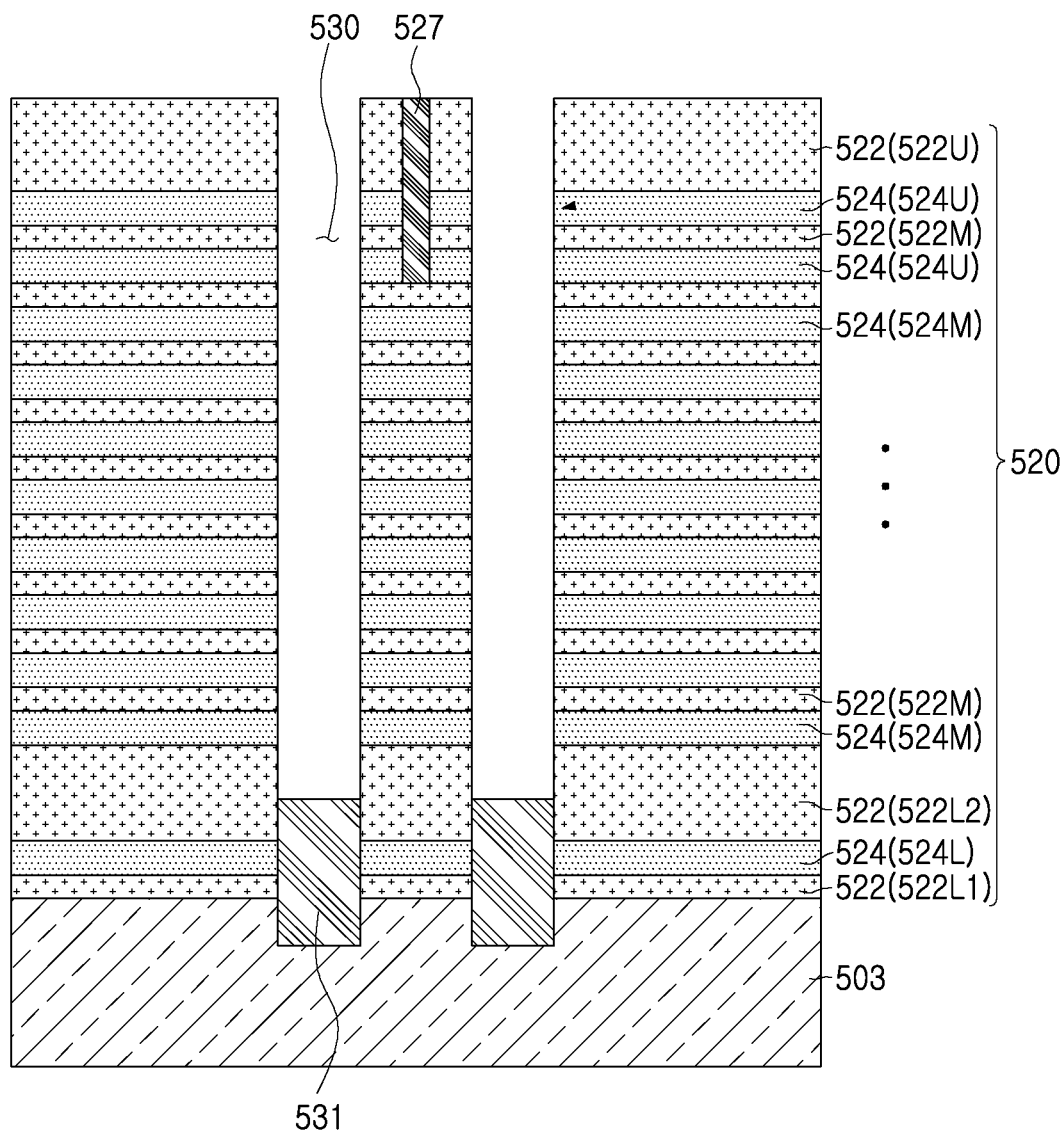
FIGS. 14A to 14C are cross-sectional views illustrating another example of a method of forming a semiconductor device, according to an example embodiment of the present inventive concept.
Figure 14B:
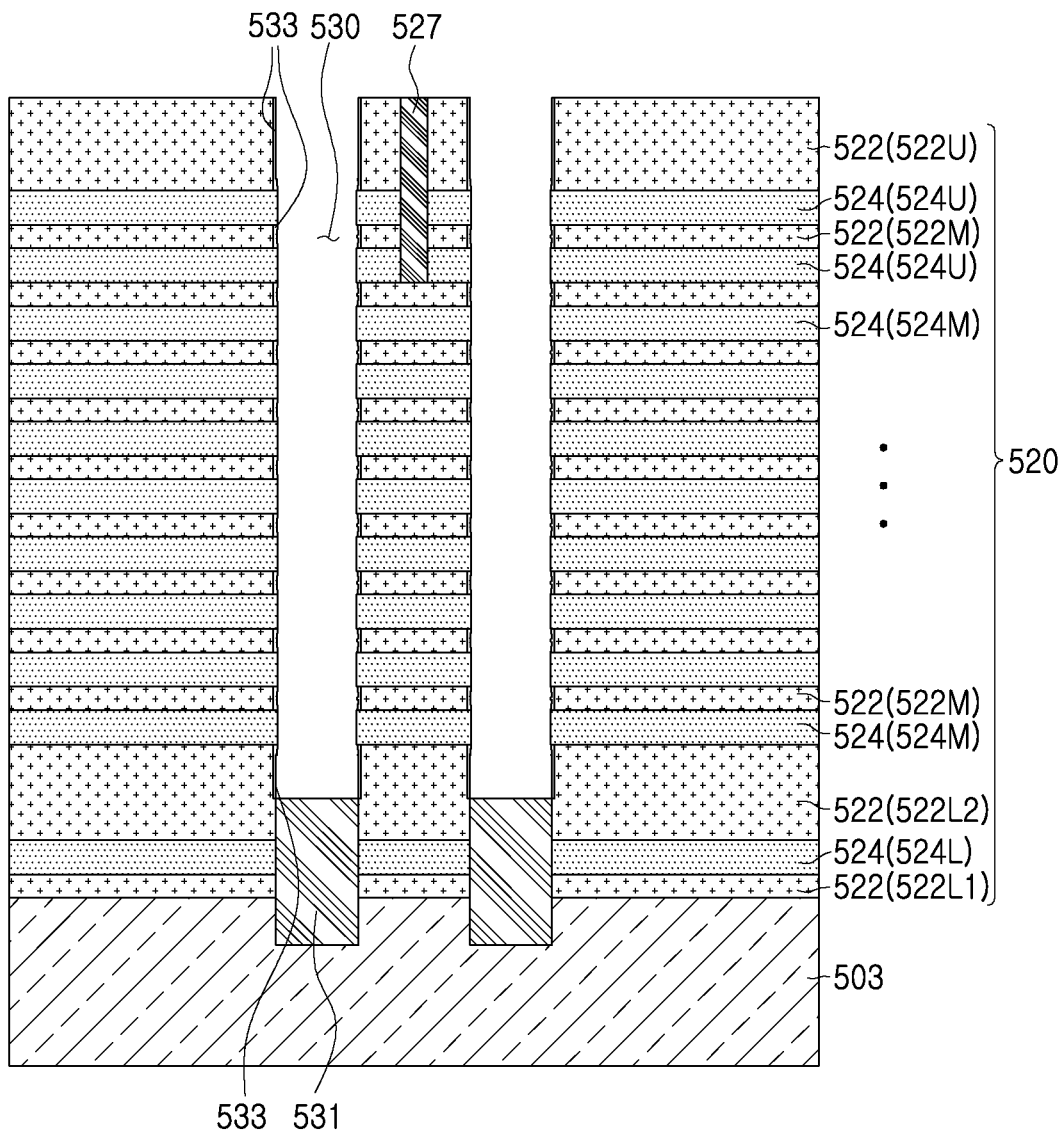
Figure 14C:
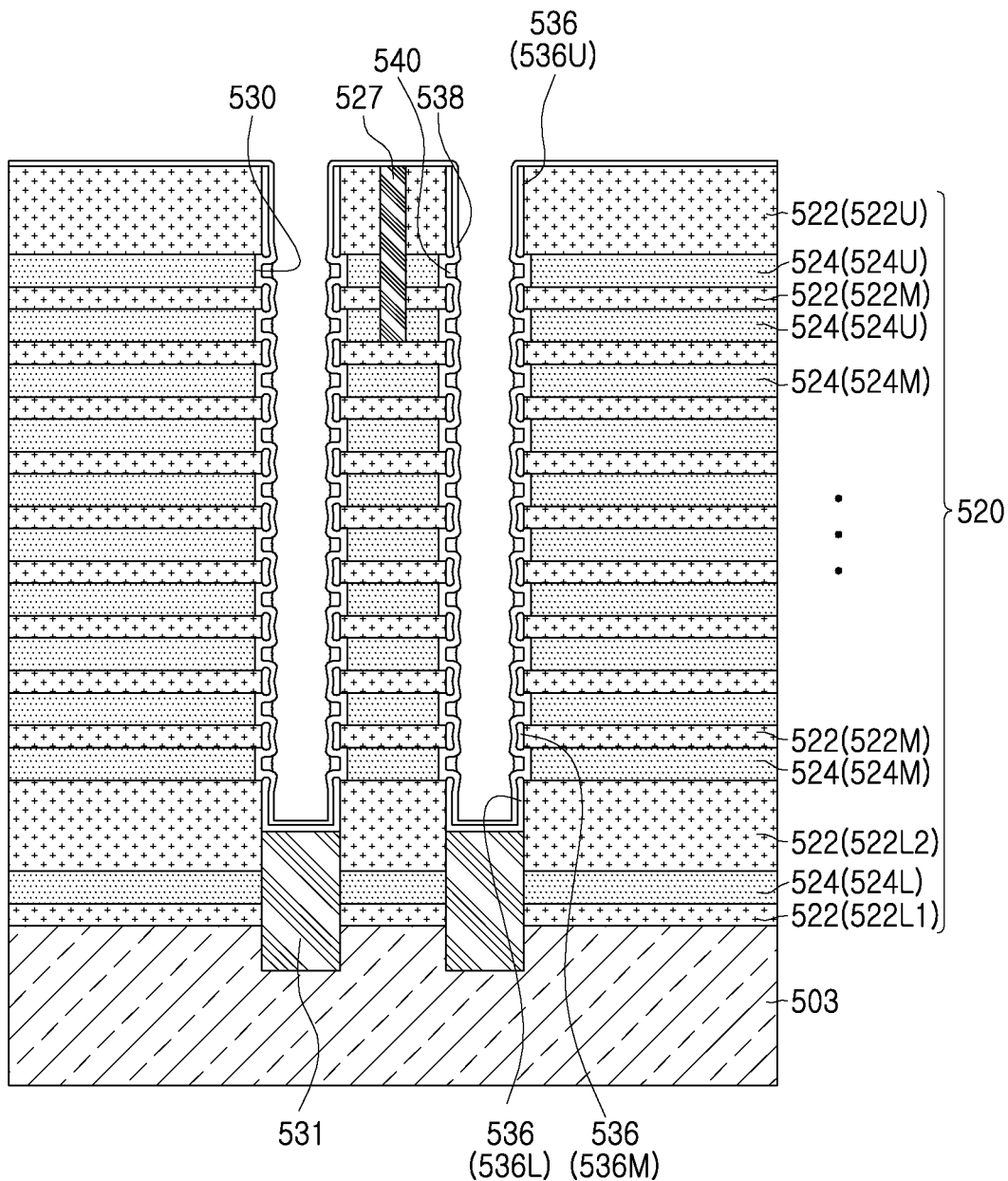

Next, a method of forming the semiconductor device described with reference to FIG. 11 will be described with reference to FIGS. 14A to 14C. FIGS. 14A to 14C are cross-sectional views illustrating a method of forming the semiconductor device described with reference to FIG. 11.

Referring to FIG. 14A, a mold structure 520 may be formed on a lower structure 503. The mold structure 520 may include interlayer insulating layers 522 and sacrificial gate layers 524, alternately and repeatedly stacked. The interlayer insulating layers 522 may be formed of silicon oxide, and the sacrificial gate layers 524 may be formed of a material having etch selectivity with the interlayer insulating layers 522, for example, silicon nitride.

The interlayer insulating layers 522 may include a first lower interlayer insulating layer 522L1, a second lower interlayer insulating layer 522L2 on the first lower interlayer insulating layer 522L1, and intermediate interlayer insulating layers 522M on the second lower interlayer insulating layer 522L2, and an upper interlayer insulating layer 522U on the intermediate interlayer insulating layers 522M. The sacrificial gate layers 524 may include a lower sacrificial gate layer 524L between the first lower interlayer insulating layer 522L1 and the second lower interlayer insulating layer 522L2, intermediate sacrificial gate layers 524M on the lower sacrificial gate layer 524L, and one or a plurality of upper sacrificial gate layers 524U on the intermediate sacrificial gate layers 524M.

An insulating pattern 527 passing through the upper interlayer insulating layer 522U, extending in a downward direction (e.g., toward an upper surface of the lower structure 503), and passing through the one or the plurality of upper sacrificial gate layers 524U may be formed.

An opening 530 passing through the mold structure 520 and exposing the lower structure 503 may be formed.

An epitaxial growth process may be performed to form a lower semiconductor pattern 531 epitaxially grown from the lower structure 503. When the lower structure 503 is formed as a silicon substrate, the lower semiconductor pattern 531 may be formed of silicon by an epitaxial growth process. An upper surface of the lower semiconductor patterns 531 may be at a lower vertical level than the intermediate sacrificial gate layers 524M.

Referring to FIG. 14B, on the lower semiconductor pattern 531, the interlayer insulating layers 522 exposed by the opening 530 may be etched, and preliminary reinforcing layers 533 may be formed on the side surfaces of the interlayer insulating layers 522. The preliminary reinforcing layers 533 may be formed of polysilicon.

The preliminary reinforcing layers 533 may include a preliminary reinforcing layer 533 contacting the second lower interlayer insulating layer 522L2 exposed by the opening 530 on the lower semiconductor pattern 531, a preliminary reinforcing layer 533 contacting the upper interlayer insulating layer 522U exposed by the opening 530, and preliminary reinforcing layers 533 contacting the intermediate interlayer insulating layers 522M exposed by the opening 530.

Referring to FIG. 14C, an oxidation process may be performed to oxidize surfaces of the preliminary reinforcing layers 533 and the lower semiconductor pattern 531, to form reinforcing patterns 536.

The reinforcing patterns 536 may include a lower reinforcing pattern 536L formed by oxidizing a preliminary reinforcing layer 533 contacting the second lower interlayer insulating layer 522L2 and an upper surface of the lower semiconductor pattern 531, an upper reinforcing pattern 536U formed by oxidizing a preliminary reinforcing layer 533 contacting the upper interlayer insulating layer 522U, and intermediate reinforcing patterns 536M formed by oxidizing preliminary reinforcing layers 533 contacting the intermediate interlayer insulating layers 522M.

Subsequently, a first dielectric layer 538 may be conformally formed. Data storage patterns 540 may be formed on the first dielectric layer 538. The data storage patterns 540 may be formed between the reinforcing patterns 536 (e.g., between reinforcing pattern 536 that are adjacent in the Z direction). The formation of the data storage patterns 540 may include forming a data storage layer on the first dielectric layer 538, and partially etching the data storage layer to allow the data storage layer to remain between the reinforcing patterns 536.

Referring back to FIG. 11, a second dielectric layer 542 may be conformally formed on the data storage patterns 540, and lower portions of the first and second dielectric layers 538 and 542 may be etched to expose at least a portion of an upper surface of the lower semiconductor pattern 531. A channel semiconductor layer 544 covering the second dielectric layer 542 and the lower semiconductor pattern 531 may be conformally formed, an insulating core region 546 partially filling the opening 530 may be formed on the channel semiconductor layer 544, and a pad pattern 548 may be formed on the insulating core region 546. Therefore, a vertical structure 550 including the lower semiconductor pattern 531, the first dielectric layer 538, the data storage patterns 540, the second dielectric layer 542, the channel semiconductor layer 544, the insulating core region 546, and the pad pattern 548 may be formed in the opening 530.

A first upper insulating layer 553 may be formed on the mold structure (e.g., the mold structure 520 of FIG. 14C). A trench passing through the first upper insulating layer 553 and the mold structure (e.g., the mold structure 520 of FIG. 14C) may be formed, the sacrificial gate layers (e.g., the sacrificial gate layers 524 of FIG. 14C) exposed by the trench may be removed to form void spaces, gate layers 565 filling the void spaces may be formed, and a separation structure 572 filling the trench may be formed.

A second upper insulating layer 575 may be formed on the separation structure 572 and the first upper insulating layer 553. A contact plug 578 passing through the first and second upper insulating layers 553 and 575 and being electrically connected to the pad pattern 548 of the vertical structure 550 may be formed. A conductive line 581 may be formed on the contact plug 578.

According to embodiments of the present inventive concept, a semiconductor device capable of improving a degree of integration, and a method of forming the same may be provided. The semiconductor device according to the example embodiment may include a data storage pattern isolated in a vertical direction. Since the data storage pattern is isolated in the vertical direction, the retention characteristics of charge trapped in the data storage pattern may be improved.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a semiconductor substrate;
a peripheral circuit region on the semiconductor substrate;
a conductive layer on the peripheral circuit region;
a first polysilicon layer on the conductive layer;
a stack structure on the first polysilicon layer; and
a vertical structure penetrating through the stack structure and contacting at least one of the first polysilicon layer and the conductive layer,
wherein the stack structure includes a plurality of gate layers and a plurality of interlayer insulating layers alternately stacked on the first polysilicon layer,
wherein the vertical structure includes an insulating core region, a channel layer, and a plurality of data storage patterns,
wherein the insulating core region extends in a vertical direction, the vertical direction being perpendicular to an upper surface of the semiconductor substrate,
wherein the channel layer includes a first portion between the stack structure and the insulating core region and a second portion contacting the first polysilicon layer,
wherein the plurality of data storage patterns are between the channel layer and the plurality of gate layers in a horizontal direction parallel to the upper surface of the semiconductor substrate, and are spaced apart from each other in the vertical direction, and
wherein a lowermost data storage pattern among the plurality of data storage patterns is at a higher level than the first polysilicon layer.

2. The semiconductor device according to claim 1,
wherein at least one of an upper surface and a lower surface in each of the plurality of data storage patterns is a concave shape.

3. The semiconductor device according to claim 1,
wherein the insulating core region includes:
an upper core portion adjacent to the stack structure in a horizontal direction; and
a lower core portion adjacent to the first polysilicon layer in the horizontal direction,
wherein the horizontal direction is parallel to the upper surface of the semiconductor substrate,
wherein the lower core portion of the insulating core region includes:
a first lower portion;
an intermediate portion on the first lower portion; and
a first upper portion on the intermediate portion, and
wherein a maximum width of the intermediate portion is greater than a minimum width of each of the first lower portion and the first upper portion.

4. The semiconductor device according to claim 3,
wherein the insulating core region further includes:
a second lower portion below the first lower portion; and
a second upper portion on the first upper portion,
wherein a maximum width of the second upper portion is greater than the minimum width of the first upper portion, and
wherein a maximum width of the second lower portion is greater than the minimum width of the first lower portion.

5. The semiconductor device according to claim 1, wherein the conductive layer includes at least one of polysilicon or metal.

6. The semiconductor device according to claim 1,
wherein a lower end of the vertical structure is at a lower level than an upper surface of the conductive layer, and
wherein the conductive layer contacts the first polysilicon layer and is spaced apart from the channel layer.

7. The semiconductor device according to claim 1, further comprising:
a second polysilicon layer between the first polysilicon layer and the stack structure,
wherein a lower surface of the first polysilicon layer contacts an upper surface of the conductive layer,
wherein an upper surface of the first polysilicon layer contacts a lower surface of the second polysilicon layer, and
wherein the conductive layer and the second polysilicon layer are spaced apart from the channel layer.

8. The semiconductor device according to claim 7,
wherein the vertical structure further includes:
a first dielectric layer including a first upper dielectric portion; and
a second dielectric layer including a second upper dielectric portion,
wherein at least a portion of the first upper dielectric portion is between the plurality of data storage patterns and the channel layer, and wherein at least a portion of the second upper dielectric portion is between the plurality of data storage patterns and the plurality of gate layers.

9. The semiconductor device according to claim 8,
wherein the first dielectric layer further includes a first lower dielectric portion below the first upper dielectric portion,
wherein the second dielectric layer further includes a second lower dielectric portion below the second upper dielectric portion,
wherein the first upper dielectric portion and the first lower dielectric portion are spaced apart from each other by the first polysilicon layer, and
wherein the second upper dielectric portion and the second lower dielectric portion are spaced apart from each other by the first polysilicon layer.

10. The semiconductor device according to claim 9,
wherein the first polysilicon layer includes:
   a first polysilicon portion between the conductive layer and the second polysilicon layer; and
   a second polysilicon portion between the second upper dielectric portion and the second lower dielectric portion, and
wherein a distance between an upper end of the second polysilicon portion and a lower end of the second polysilicon portion is greater than a distance between an upper surface of the first polysilicon portion and a lower surface of the first polysilicon portion.

11. The semiconductor device according to claim 9, further comprising:
a substrate insulating layer between the conductive layer and the second lower dielectric portion,
wherein the first lower dielectric portion is between the second lower dielectric portion and a lower portion of the insulating core region.

12. The semiconductor device according to claim 1,
wherein each of the plurality of data storage patterns includes a first side surface facing a corresponding one of the plurality of gate layers, and a second side surface facing the channel layer, and
wherein at least a portion of the second side surface is a concave shape.

13. A semiconductor device comprising:
a first structure including a first substrate, a second substrate, and a peripheral circuit region between the first substrate and the second substrate;
a second structure including a plurality of gate layers and a plurality of interlayer insulating layers alternately stacked, and overlapping the first structure in a vertical direction perpendicular to an upper surface of the first substrate; and
a vertical structure penetrating through the second structure in the vertical direction and contacting the second substrate of the first structure,
wherein the vertical structure includes:
   an insulating core region extending in the vertical direction;
   a channel layer on a side surface of the insulating core region;
   a first dielectric layer between the channel layer and the plurality of gate layers and the plurality of interlayer insulating layers of the second structure;
   a second dielectric layer between the first dielectric layer and the plurality of gate layers, and between the first dielectric layer and the plurality of interlayer insulating layers of the second structure; and
   a plurality of data storage patterns between the first dielectric layer and the second dielectric layer, and spaced apart from each other in the vertical direction,
wherein the plurality of data storage patterns are adjacent to the plurality of gate layers in a horizontal direction parallel to the upper surface of the first substrate,
wherein the plurality of data storage patterns include a first data storage pattern adjacent to a first gate layer of the plurality of gate layers in the horizontal direction,
wherein the first data storage pattern has a first side surface facing the first gate layer and a second side surface facing the channel layer,
wherein the second side surface of the first data storage pattern has a concave portion, and
wherein the second dielectric layer contacts the second side surface of the first data storage pattern and a portion of the first dielectric layer.

14. The semiconductor device according to claim 13,
wherein the second side surface of the first data storage pattern has curved shapes on and below the concave portion.

15. The semiconductor device according to claim 13, further comprising:
a polysilicon layer,
wherein the polysilicon layer contacts the second substrate and the channel layer.

16. The semiconductor device according to claim 13,
wherein the second substrate includes at least one of polysilicon or metal.

17. The semiconductor device according to claim 13,
wherein the insulating core region includes a convex portion facing the second side surface of the first data storage pattern, a first concave portion below the convex portion, and a second concave portion on the convex portion,
wherein the insulating core region includes at least two inflection points including a first inflection point between the first concave portion and the convex portion, and a second inflection point between the convex portion and the second concave portion, and
wherein a distance between the first inflection point and the second inflection point is smaller than a maximum thickness of the first data storage pattern in a vertical direction.

18. A semiconductor device comprising:
a first structure including a first substrate, a second substrate, and a peripheral circuit region between the first substrate and the second substrate;
a second structure including a plurality of gate layers and a plurality of interlayer insulating layers alternately stacked, and overlapping the first structure in a vertical direction perpendicular to an upper surface of the first substrate; and
a vertical structure penetrating through the second structure in the vertical direction and contacting the second substrate of the first structure,
wherein the vertical structure includes:
   an insulating core region extending in the vertical direction;
   a channel layer on a side surface of the insulating core region;
   a first dielectric layer between the channel layer and the plurality of gate layers and the plurality of interlayer insulating layers of the second structure;
   a second dielectric layer between the first dielectric layer and the plurality of gate layers, and between the first dielectric layer and the plurality of interlayer insulating layers of the second structure; and a plurality of data storage patterns between the first dielectric layer and the second dielectric layer, and spaced apart from each other in the vertical direction, wherein the plurality of data storage patterns are adjacent to the plurality of gate layers in a horizontal direction parallel to the upper surface of the first substrate, wherein the plurality of data storage patterns include a first data storage pattern adjacent to a first gate layer of the plurality of gate layers in the horizontal direction, and wherein at least one of an upper surface and a lower surface in each of the first data storage pattern has a concave shape.

19. The semiconductor device according to claim 18, wherein the first data storage pattern has a first side surface facing the first gate layer and a second side surface facing the channel layer, and wherein a distance between an upper end and a lower end of the first side surface is smaller than a distance between an upper end and a lower end of the second side surface.

20. The semiconductor device according to claim 18, further comprising:

a polysilicon layer, wherein the polysilicon layer contacts the second substrate and the channel layer, and wherein the second substrate includes at least one of polysilicon or metal.

* * * * *